(12) United States Patent
Kuang

(10) Patent No.: US 12,424,157 B2
(45) Date of Patent: Sep. 23, 2025

(54) DISPLAY PANEL, METHOD FOR DRIVING THE SAME AND DISPLAY APPARATUS

(71) Applicant: Xiamen Tianma Display Technology Co., Ltd., Fujian (CN)

(72) Inventor: Jian Kuang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/963,551

(22) Filed: Nov. 28, 2024

(65) Prior Publication Data

US 2025/0095560 A1  Mar. 20, 2025

(30) Foreign Application Priority Data

Aug. 29, 2024 (CN) .......................... 202411204462.5

(51) Int. Cl.
*G09G 3/32* (2016.01)
*G11C 19/28* (2006.01)

(52) U.S. Cl.
CPC ............... *G09G 3/32* (2013.01); *G11C 19/28* (2013.01); *G09G 2300/0842* (2013.01); *G09G 2300/0861* (2013.01); *G09G 2310/0267* (2013.01); *G09G 2310/0286* (2013.01); *G09G 2310/08* (2013.01)

(58) Field of Classification Search
CPC ............. G09G 3/32; G09G 2300/0842; G09G 2300/0861; G09G 2310/0267; G09G 2310/0286; G09G 2310/08; G09G 3/20; G09G 3/3266; G09G 3/3677; G11C 19/28
See application file for complete search history.

(56) References Cited

U.S. PATENT DOCUMENTS

| 2018/0374410 A1* | 12/2018 | Zhu ........................ G11C 19/28 |
| 2019/0325800 A1* | 10/2019 | Xiang ................... G11C 19/287 |
| 2022/0076611 A1* | 3/2022 | Lai ........................ G09G 3/2092 |
| 2024/0135848 A1* | 4/2024 | Cao ........................ G09G 3/3266 |

FOREIGN PATENT DOCUMENTS

CN    117612469 A    2/2024

* cited by examiner

*Primary Examiner* — Pegeman Karimi
(74) *Attorney, Agent, or Firm* — Wiersch Law Group

(57) ABSTRACT

A display panel includes a shift register including stages of shift circuits arranged in cascade. At least one of the shift circuits includes a driving unit and a gating unit. The driving unit has a first node and a second node, outputs a second level when a potential of the first node is a first level, and outputs the first level when a potential of the second node is the first level. The gating unit includes a first control module and a gating output module. The first control module writes a signal of the first node into a third node when a frequency control signal received by the first control module is the first level. The gating output module outputs the second level when a potential of the third node is the first level and output the first level when a potential of the second node is the first level.

23 Claims, 16 Drawing Sheets

DISPLAY PANEL, METHOD FOR DRIVING THE SAME AND DISPLAY APPARATUS

CROSS-REFERENCE TO RELATED APPLICATION

The present application claims priority to Chinese Patent Application No. 202411204462.5, filed on Aug. 29, 2024, the content of which is incorporated herein by reference in its entirety.

TECHNICAL FIELD

The present disclosure relates to the field of display technologies, and in particular, to a display panel, a method for driving the display panel, and a display apparatus.

BACKGROUND

Partition frequency-division control of a display panel is important in the display technology, which enable the display panel to perform well in handling different types of content such as dynamic images and static texts.

However, the circuit structure of the shift register used in the related art is complex with a large number of transistors and the requirements for arranging two different types of N-type and P-type transistors, so that the circuits has poor reliability, and the shift register occupies a large frame width.

SUMMARY

In an aspect, embodiments of the present disclosure provide a display panel. The display panel includes a shift register. The shift register includes a plurality of stages of shift circuits arranged in cascade. At least one of the shift circuits includes a driving unit and a gating unit, wherein an output signal of the driving unit in a previous stage of the shift circuit is an input signal of the driving unit in a next stage of the shift circuit. The driving unit has a first node and a second node, and the driving unit outputs a second level when a potential of the first node is a first level, and outputs the first level when a potential of the second node is the first level. The gating unit includes a first control module and a gating output module. The first control module is configured to write a signal of the first node into a third node when a frequency control signal received by the first control module is the first level. The gating output module is configured to output the second level when a potential of the third node is the first level, and output the first level when a potential of the second node is the first level.

In another aspect, embodiments of the present disclosure provide a method for driving a display panel. The display panel includes a shift register. The shift register includes a plurality of stages of shift circuits arranged in cascade. At least one of the shift circuits includes a driving unit and a gating unit. The driving unit has a first node and a second node. The gating unit includes a first control module and a gating output module. The method includes following steps: controlling the driving unit to output a second level when a potential of the first node is a first level, and controlling the driving unit to output the first level when a potential of the second node is the first level, wherein an output signal of the driving unit in a previous stage of the shift circuit is an input signal of the driving unit in a next stage of the shift circuit; controlling the first control module to write a signal of the first node into a third node when a frequency control signal received by the first control module is a first level; and controlling the gating output module to output the second level when a potential of the third node is the first level, and controlling the gating output module to output the first level when a potential of the second node is the first level.

In a still another aspect, embodiments of the present disclosure provide a display apparatus. The display apparatus includes a display panel. The display panel includes a shift register. The shift register includes a plurality of stages of shift circuits arranged in cascade. At least one of the shift circuits includes a driving unit and a gating unit, wherein an output signal of the driving unit in a previous stage of the shift circuit is an input signal of the driving unit in a next stage of the shift circuit. The driving unit has a first node and a second node, and the driving unit outputs a second level when a potential of the first node is a first level, and outputs the first level when a potential of the second node is the first level. The gating unit includes a first control module and a gating output module. The first control module is configured to write a signal of the first node into a third node when a frequency control signal received by the first control module is the first level. The gating output module is configured to output the second level when a potential of the third node is the first level, and output the first level when a potential of the second node is the first level.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing embodiments, rather than limiting the present disclosure. The terms "a", "an", "the" and "said" in a singular form in the embodiment of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

Before describing the technical solutions provided by the embodiments of the present disclosure, the present disclosure first describes an application background of the shift register and problems existing in the shift register in the related art.

The display panel includes a pixel circuit and a light-emitting element. The pixel circuit is configured to provide a driving current to the light-emitting element to drive the light-emitting element to emit light.

Figure 1:
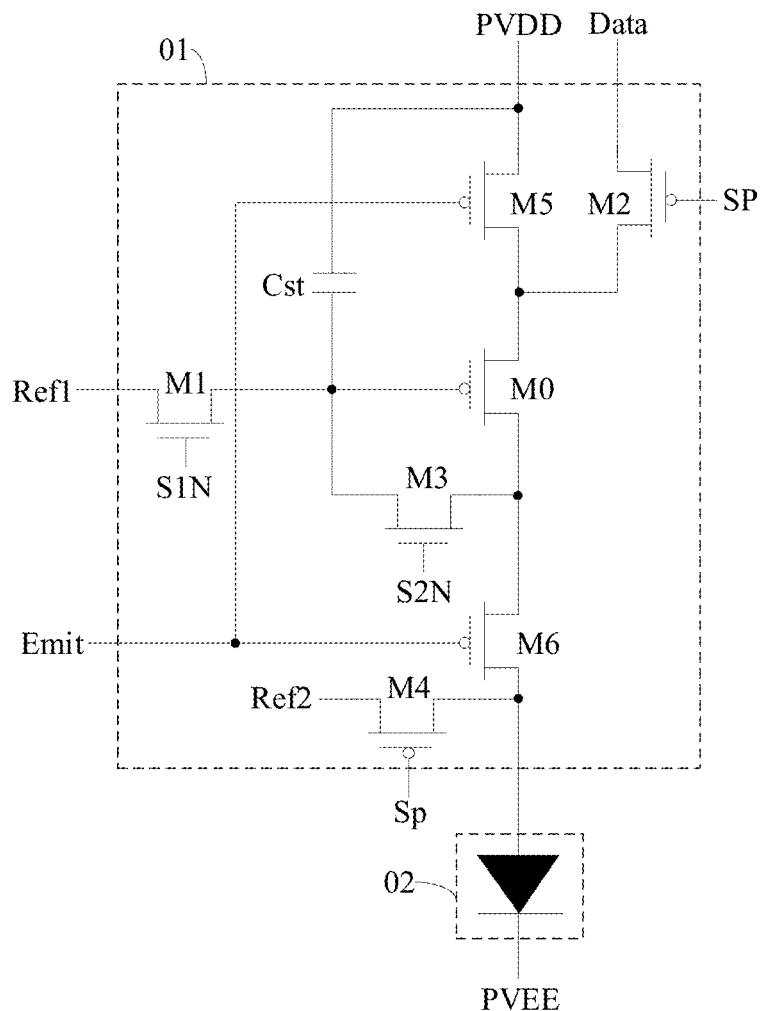
FIG. 1 is a schematic circuit diagram of a pixel circuit according to some embodiments of the present disclosure.

FIG. 1 is a schematic diagram of a circuit structure of a pixel circuit according to some embodiments of the present disclosure. As shown in FIG. 1, in an circuit structure of the pixel circuit, the pixel circuit 01 includes a driving transistor M0, a gate reset transistor M1, a data writing transistor M2, a threshold compensation transistor M3, an anode reset transistor M4, a first light-emitting control transistor M5, a second light-emitting control transistor M2, and a storage capacitor Cst.

The gate reset transistor M1 is an oxide semiconductor transistor, for example, an indium gallium zinc oxide (IGZO) transistor. A gate of the gate reset transistor M1 is electrically connected to a first scan line S1N. The first electrode is electrically connected to a first reset line Ref1. The second electrode is electrically connected to a gate of the driving transistor M0.

The data writing transistor M2 has a gate electrically connected to a second scan line SP, a first electrode electrically connected to the data line Data, and a second electrode electrically connected to the first electrode of the driving transistor M0.

The threshold compensation transistor M3 is an oxide semiconductor transistor, for example, an IGZO transistor. The threshold compensation transistor M3 has a gate electrically connected to the third scan line S2N, a first electrode electrically connected to the second electrode of the driving transistor M0, and a second electrode electrically connected to the gate of the driving transistor M0.

The anode reset transistor M4 has a gate electrically connected to the second scan line SP, a first electrode electrically connected to the second reset line Ref2, and a second electrode electrically connected to the anode of the light-emitting element 02.

The first light-emitting control transistor M5 has a gate electrically connected to the light-emitting control line Emit, a first electrode electrically connected to the power line PVDD, and a second electrode electrically connected to the first electrode of the driving transistor M0.

The second light-emitting control transistor M6 has a gate electrically connected to the light-emitting control line Emit, a first electrode electrically connected to the second electrode of the driving transistor M0, and a second electrode electrically connected to the anode of the light-emitting element 02.

The first plate of the storage capacitor Cst is electrically connected to the gate of the driving transistor M0, and the second plate is electrically connected to the anode of the light-emitting element 02.

Figure 2:
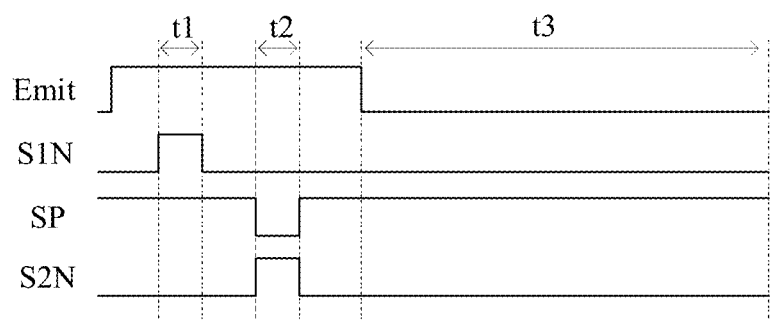
FIG. 2 is a timing sequence corresponding to FIG. 1 according to some embodiments of the present disclosure.

FIG. 2 is a timing sequence corresponding to FIG. 1. As shown in FIG. 2, the driving period of the pixel circuit 01 includes a reset period t1, a charging period t2 and a light-emitting control period t3.

In the reset period t1, the first scan line S1N provides a high level, and the gate reset transistor M1 is turned on to reset the gate of the driving transistor M0.

In the charging period t2, the second scan line SP provides a low level, and the third scan line S2N provides a high level. The data writing transistor M2, the threshold compensation transistor M3 and the anode reset transistor M4 are turned on to charge and threshold-compensate the driving transistor M0, as well as reset the anode of the light-emitting element 02.

In the light-emitting control period t3, the light-emitting control line Emit provides a low level, the first light-emitting control transistor M5 and the second light-emitting control transistor M6 are turned on, and the driving current converted by the driving transistor M0 flows into the light-emitting element 02 to control the light-emitting element 02 to emit light.

It can be understood that the first scan line S1N, the second scan line SP, the third scan line S2N, and the light-emitting control signal line Emit are all connected to respective corresponding shift registers thereof.

The shift register mentioned later in the embodiments of the present disclosure is a shift register connected to the third scan line S2N. The shift register includes a plurality of shift circuits arranged in cascade. When the display panel performs partition frequency-division display, the display panel includes a plurality of sub-regions, which include a high-frequency sub-region and a low-frequency sub-region. For the high-frequency sub-region, the shift circuit corresponding to the high-frequency sub-region needs to output a high level in each frame, so that the pixel circuit in the high-frequency sub-region can perform data refresh in each frame. For the low-frequency sub-region, the shift circuit corresponding to the low-frequency sub-region only outputs a high level in some frames, and continuously outputs a low level in other frames, so that the pixel circuit in the low-frequency sub-region only performs data refresh in some frames.

Figure 3:
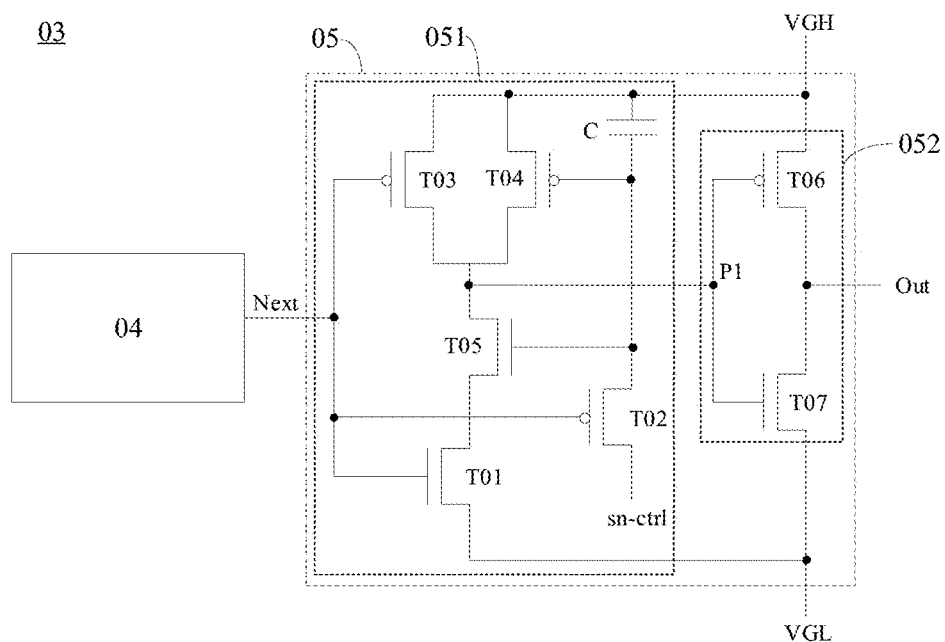
FIG. 3 is a schematic diagram of a circuit structure of a shift circuit in the related art.

In the related art, the shift circuit shown in FIG. 3 is usually configured to implement the above-mentioned partition frequency-division function.

FIG. 3 is a schematic circuit structure diagram of a shift circuit in the related art, as shown in FIG. 3, the shift circuit 03 includes a driving unit 04 and a gating unit 05.

The driving unit 04 has a signal shift function and is a conventional shift register structure. The driving unit 04 has a first output terminal Next. A first output terminal Next of the driving unit 04 in the previous stage of shift circuits 03 is electrically connected to a shift control terminal of the driving unit 04 in the next stage of shift circuits 03, that is, a signal output by the first output terminal Next of the previous stage of shift circuits 03 is configured as an input signal of the next stage of shift circuits 03.

The gating unit 05 includes a control module 051 and an output module 052.

The control module 051 includes a first switch transistor T01 to a fifth switch transistor T05 and a capacitor C. Gates of the first switch transistor T01, the second switch transistor T02 and the third switch transistor T03 are electrically connected to the first output terminal Next, respectively. A first electrode of the second switch transistor T02 receives a frequency control signal sn-ctrl. The switch transistor in the control module 051 is configured to output a signal to the node P1 under cooperation of the signal output by the first output terminal Next and the frequency control signal sn-ctrl.

The output module 052 includes a sixth switching transistor T06 and a seventh switching transistor T07. A gate of the sixth switch transistor T06 and a gate of the seventh switch transistor T07 are both electrically connected to a node P1. A first electrode of the sixth switch transistor T06 is electrically connected to a first constant voltage line VGH. A first electrode of the seventh switch transistor T07 is electrically connected to a second constant voltage line VGL. A second electrode of the sixth switch transistor T06 and a second electrode of the seventh switch transistor T07 are both electrically connected to a second output terminal Out. The signal output by the second output terminal Out may be regarded as a third scanning signal output by the entire shift circuits 03 to the pixel circuit 01.

However, the design of the gating unit 05 in the shift circuit 03 has following disadvantages.

Firstly, the gates of the two output transistors (e.g., the sixth switch transistor T06 and the seventh switch transistor T07) in the output module 052 are only connected to the node P1, so that the two output transistors must be designed as transistors of different types, and only in this way, the second output terminal Out can normally output two levels of high level and low level. Further, for the gating unit 05, an N-type transistor needs to be introduced at least in the design of the output tube. Compared with a P-type transistor, an N-type transistor has poor device stability. Therefore, the introduction of the N-type transistor will have an impact on the operational reliability of the entire shift circuit 03.

Secondly, the control module 051 only writes a signal to the node P1 under the cooperation of the signal output by the first output terminal Next and the frequency control signal sn-ctrl, thereby controlling the two output transistors to be in a correct operating state. The number of the input signals of the control module 051 is relatively small, so when the internal circuit structure of the control module 051 is designed, more transistors and types are required, resulting in a more complex internal structure of the control module 051.

In conclusion, the shift circuit 03 in the related art has a relatively complex circuit structure, which not only has poor circuit reliability, but also needs to occupy a large space in the frame, making it difficult to implement a narrow frame design.

In order to solve the problems existing in the related art, the present disclosure provide a display panel which can achieve better performance of the shift circuit by designing the circuit structure of the gating unit.

Figure 4:
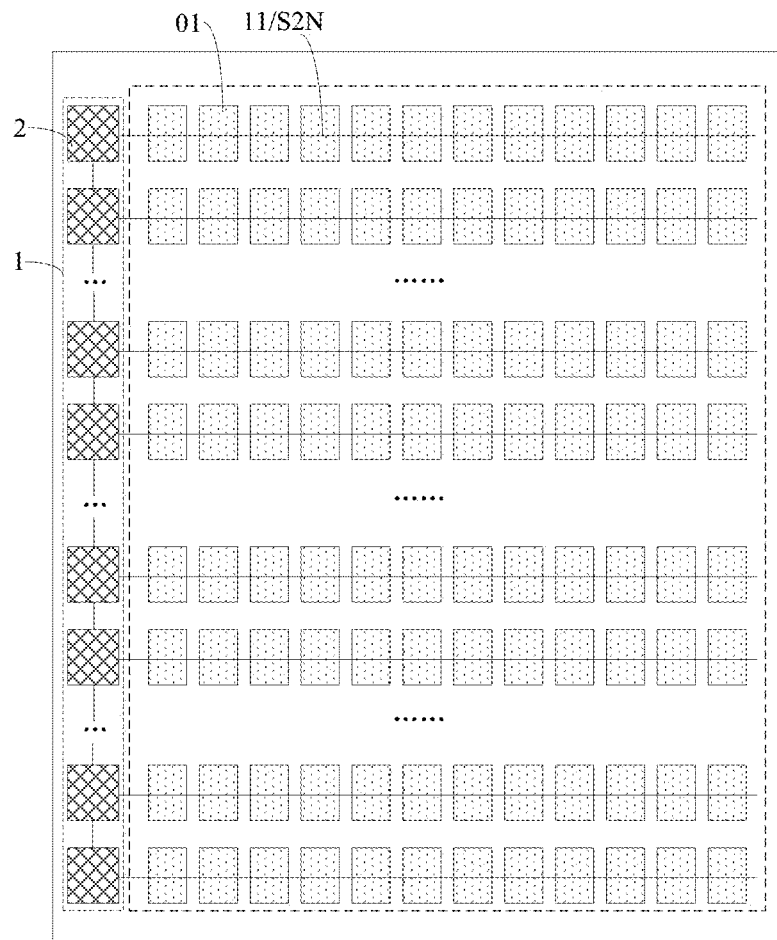
FIG. 4 is a schematic structural diagram of a display panel according to some embodiments of the present disclosure.
Figure 5:
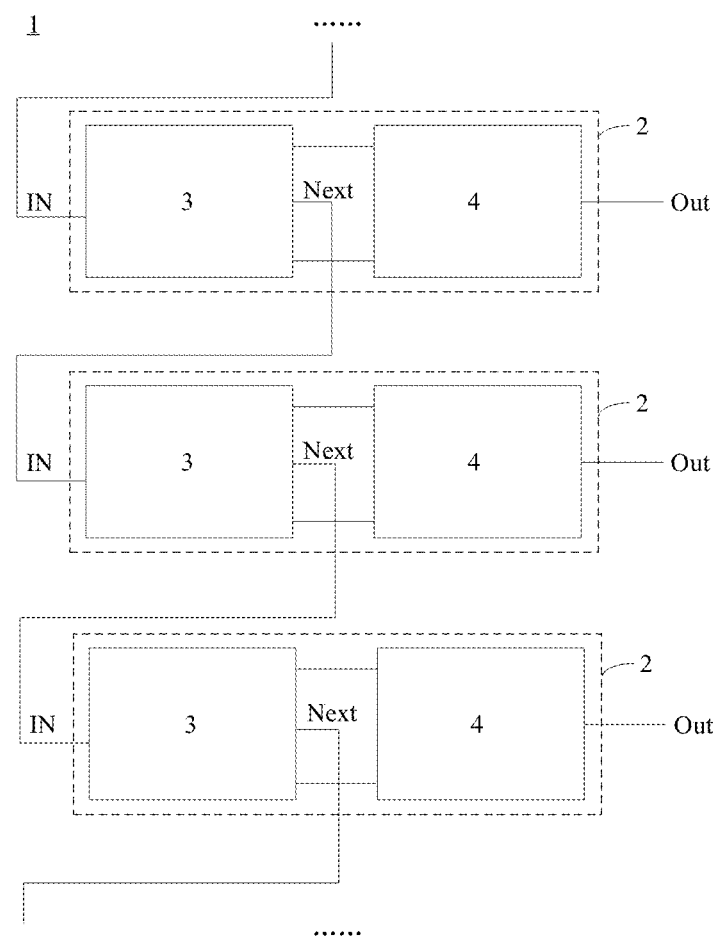
FIG. 5 is a schematic structural diagram of a shift register according to some embodiments of the present disclosure.
Figure 6:
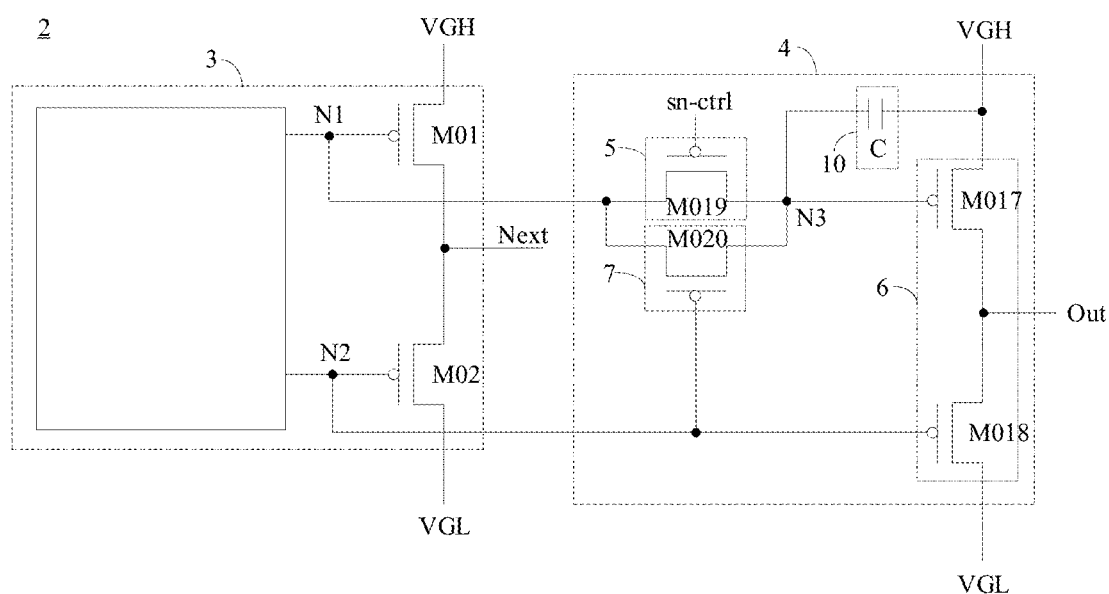
FIG. 6 is a schematic structural diagram of a shift circuit according to some embodiments of the present disclosure.

As shown in FIG. 4 to FIG. 6, FIG. 4 is a schematic structural diagram of a display panel according to some embodiments of the present disclosure, FIG. 5 is a schematic structural diagram of a shift register 1 according to some embodiments of the present disclosure, and FIG. 6 is a schematic structural diagram of a shift circuit 2 according to some embodiments of the present disclosure. The display panel includes a shift register 1. The shift register is configured to provide a scanning signal to the threshold compensation transistor M3 in the pixel circuit 01. The shift register 1 includes a plurality of stages of shift circuits 2 arranged in cascade. The shift circuit 2 includes a driving unit 3 and a gating unit 4.

The driving unit 3 is a structure having a signal shift function in the shift circuit 2. An output signal of the driving unit 3 in the previous stage of the shift circuit 2 is an input signal of the driving unit 3 in the next stage of the shift circuit 2. That is, referring to FIG. 5, the driving unit 3 has a shift control terminal IN and a first output terminal Next. The first output terminal Next of the driving unit 3 in the previous stage of the shift circuit 2 is electrically connected to the shift control terminal IN of the driving unit 3 in the next stage of shift circuit 2.

Moreover, referring to FIG. 6, the driving unit 3 has a first node N1 and a second node N2. The driving unit 3 outputs a second level when a potential of the first node N1 is the first level, and outputs the first level when a potential of the second node N2 is the first level. Following embodiments of the present invention will be explained using the example of the first level being a low level and the second level being a high level.

It can be understood that the driving unit 3 includes two output transistors. The first node N1 and the second node N2 are nodes for the conduction state of the two output transistors. Referring to FIG. 6, the driving unit 3 includes a first transistor M01 and a second transistor M02. A gate of the first transistor M01 is electrically connected to the first node N1. When the first node N1 is a low level, the first transistor M01 is turned on and outputs a high level to the first output terminal Next. A gate of the second transistor M02 is electrically connected to the second node N2. When the second node N2 is a low level, the second transistor M02 is turned on and outputs a low level to the first output terminal Next.

The gating unit 4 includes a first control module 5 and a gating output module 6. The first control module 5 is configured to write a signal of the first node N1 into the third node N3 when a frequency control signal sn-ctrl received by the first control module 5 is the first level. The gating output module 6 is configured to output the second level when a potential of the third node N3 is the first level, and output the first level when a potential of the second node N2 is the first level. The gating output module 6 has a second output terminal Out. A signal output by the second output terminal Out may be regarded as a signal output by the entire shift circuit 2 to the pixel circuit 01.

In some embodiments of the present disclosure, the gating output module 6 in the gating unit 4 outputs a high level when the third node N3 is a low level and outputs a low level when the second node N2 is a low level, which means that the conduction state of one output transistor in the gating output module 6 is directly or indirectly controlled by the third node N3, and the conduction state of the other output transistor is directly or indirectly controlled by the second node N2. When the conduction states of the two output transistors in the gating output module 6 are respectively controlled by different nodes, the two output transistors may be designed as transistors of the same type, for example, P-type transistors, so that the N-type transistor may not have to be introduced in the gating unit 4, thereby avoiding the influence of the device characteristics of the N-type transistor on the circuit reliability.

In addition, the node potentials for controlling the conduction states of the two output transistors in the gating output module 6 are respectively related to the node potentials for controlling the conduction states of the two output transistors in the driving unit 3: a potential of the third node N3 of one output transistor in the control gating output module 6 is related to a potential of the first node N1 of one output transistor in the control driving unit 3, and a potential of the another output transistor in the control gating output module 6 is directly a potential of the second node N2 of the another output transistor in the control driving unit 3, which means that the gate potentials of the two output transistors in the gating unit 4 can be determined by the potentials of the two nodes connected to the gates of the two output transistors in the shift unit. For example, if the shift circuit 2 is expected to normally output a high level, the first control module 5 may be controlled to be turned on, and then the first node N1 is written into the third node N3 when the first node N1 is a low level, and then the gating output module 6 is controlled to output a high level; if the shift circuit 2 is expected to stop outputting a high level, the first control module 5 may be controlled to be turned off, and then the low level cannot be written into the third node N3 when the first node N1 is a low level, so that the gating output module 6 cannot output a high level. Compared with the related art, the input signal of the gating unit 4 is increased, so that the internal structure design of the gating unit 4 can be greatly simplified, thereby reducing the number of transistors in the gating unit 4, making the transistors in the gating unit 4 only adopt P-type transistors, improving the operating reliability of the shift circuit 2, and thus reducing the space occupied by the shift circuit 2 in the frame.

Moreover, based on the gating unit provided by the embodiments of the present disclosure, the display panel can achieve the partition frequency-division function.

Figure 7:
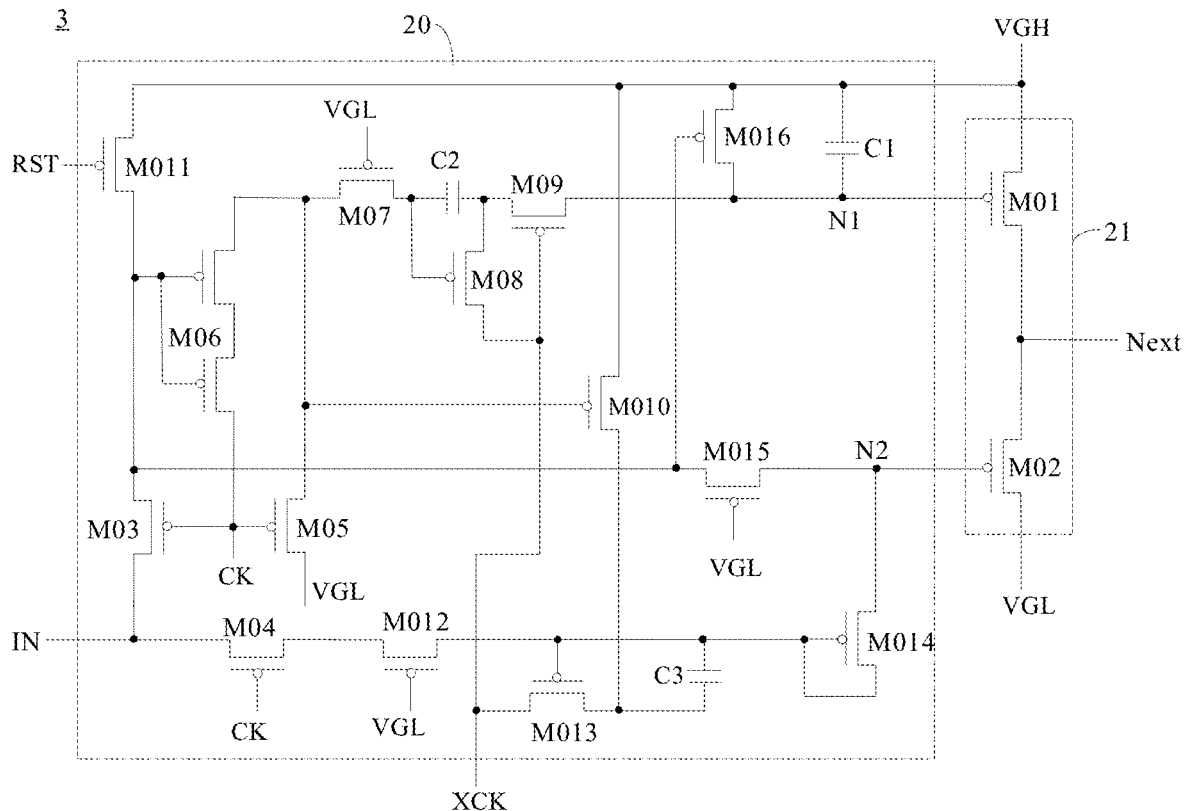
FIG. 7 is a schematic structural diagram of a driving unit according to some embodiments of the present disclosure.

First, taking the circuit structure of the driving unit 3 shown in FIG. 7 as an example, the operating process of the driving unit 3 is first described to clearly understand the relationship among the potentials of the first node N1, the second node N2 and the first output terminal Next.

Figure 8:
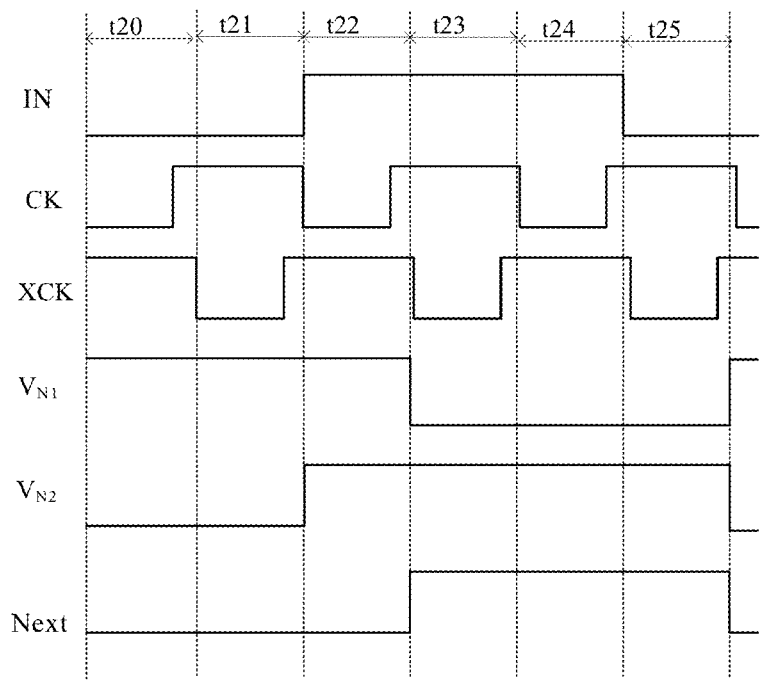
FIG. 8 is a timing sequence corresponding to FIG. 7 according to some embodiments of the present disclosure.

As shown in FIG. 7 and FIG. 8, FIG. 7 is a schematic structural diagram of a driving unit 3 according to some embodiments of the present disclosure, FIG. 8 is a timing sequence corresponding to FIG. 7, and the driving unit 3 includes a driving control module 20 and a driving output module 21.

The driving output module 21 includes a first transistor M01 and a second transistor M02. A gate of the first transistor M01 is electrically connected to the first node N1, a first electrode of the first transistor M01 is electrically connected to the first constant voltage line VGH, and a second electrode of the first transistor M01 is electrically connected to the first output terminal Next. A gate of the second transistor M02 is electrically connected to the second node N2, a first electrode of the second transistor M02 is electrically connected to the second constant voltage line VGL, and a second electrode of the second transistor M02 is electrically connected to the first output terminal Next.

The driving control module 20 includes third to sixteenth transistors M03 to M016, a first capacitor C1, a second capacitor C2, and a third capacitor C3. The driving control module is electrically connected to the shift control terminal IN, the second node N2, the first node N1, the first clock signal line CK, the second clock signal line XCK, and the third constant voltage line RST. The third constant voltage line RST is configured to provide a high level to control the eleventh transistor M011 to be in an off state. The shift control terminal IN receives a signal output by the first output terminal Next of the driving unit 3 in the previous stage of the shift circuit 2. The connection relationship between the transistors and the capacitors in the driving control module 20 and the signal lines is shown in FIG. 7, which will not be elaborated here.

An operating process of the driving unit 3 includes period t20 to period t25.

In period t20: the first clock signal line CK provides a low level to control the third transistor M03, the fourth transistor M04 and the fifth transistor M05 to be turned on. The third transistor M03 writes the low level of the shift control terminal IN into the second node N2. The sixteenth transistor M016 is turned on to write a high level of the first constant voltage line VGH into the first node N1. The second transistor M02 is turned on, the first transistor M01 is turned off, and the first output terminal Next outputs a low level.

In period t21, the second clock signal line XCK provides a low level to control the ninth transistor M09 to be turned on and write a high level to the first node N1, and the first transistor M01 remains in an off state. Meanwhile, the second node N2 maintains a low level, the second transistor M02 is turned on, and the first output terminal Next continues to output a low level.

In period t22, the first clock signal line CK provides a low level to control the third transistor M03, the fourth transistor M04, and the fifth transistor M05 to be turned on. The third transistor M03 writes the high level of the shift control terminal IN into the second node N2, and the second transistor M02 is turned off. The second clock signal XCK is a high level, and the ninth transistor M09 is turned off. Meanwhile, the sixteenth transistor M016 is also turned off, so that the first node N1 maintains a high level, and the first transistor M01 is turned off. In this period, the first output terminal Next continues to output a low level.

In period t23, the second node N2 maintains a high level to control the second transistor M02 to be turned off. The eighth transistor M08 is turned on, and the second clock signal line XCK provides a low level to control the ninth transistor M09 to be turned on, so that a low level is written into the first node N1, the first node N1 is a low level to control the first transistor M01 to be turned on, and the first output terminal Next outputs a high level.

In period t24, the second node N2 maintains a high level, the first node N1 is a low level, and the first output terminal Next outputs a high level.

In period t25, although the shift control terminal IN is a low level, since the first clock signal line CK provides a high level, the low level cannot be written into the second node N2, and the second node N2 maintains a high level. The first node N1 is a low level, and the first output terminal Next outputs a high level.

Referring to FIG. 6, FIG. 11 to FIG. 13, or referring to FIG. 6, FIG. 14 to FIG. 16, the display panel includes at least two sub-regions 9, and the at least two sub-regions include a high-frequency sub-region and a low-frequency sub-region.

The display panel has a first display mode, which includes a process P1 of high-frequency to low-frequency, and/or a process P2 of low-frequency to high-frequency.

With respect to the process P1 of high-frequency to low-frequency, for example, the last stage of the shift circuit corresponding to the high-frequency sub-region is the (i2−1)-th stage of shift circuit 2 (i2−1), and the first stage of the shift circuit corresponding to the low-frequency sub-region is the i2-th stage of shift circuit 2 (i2).

Figure 11:
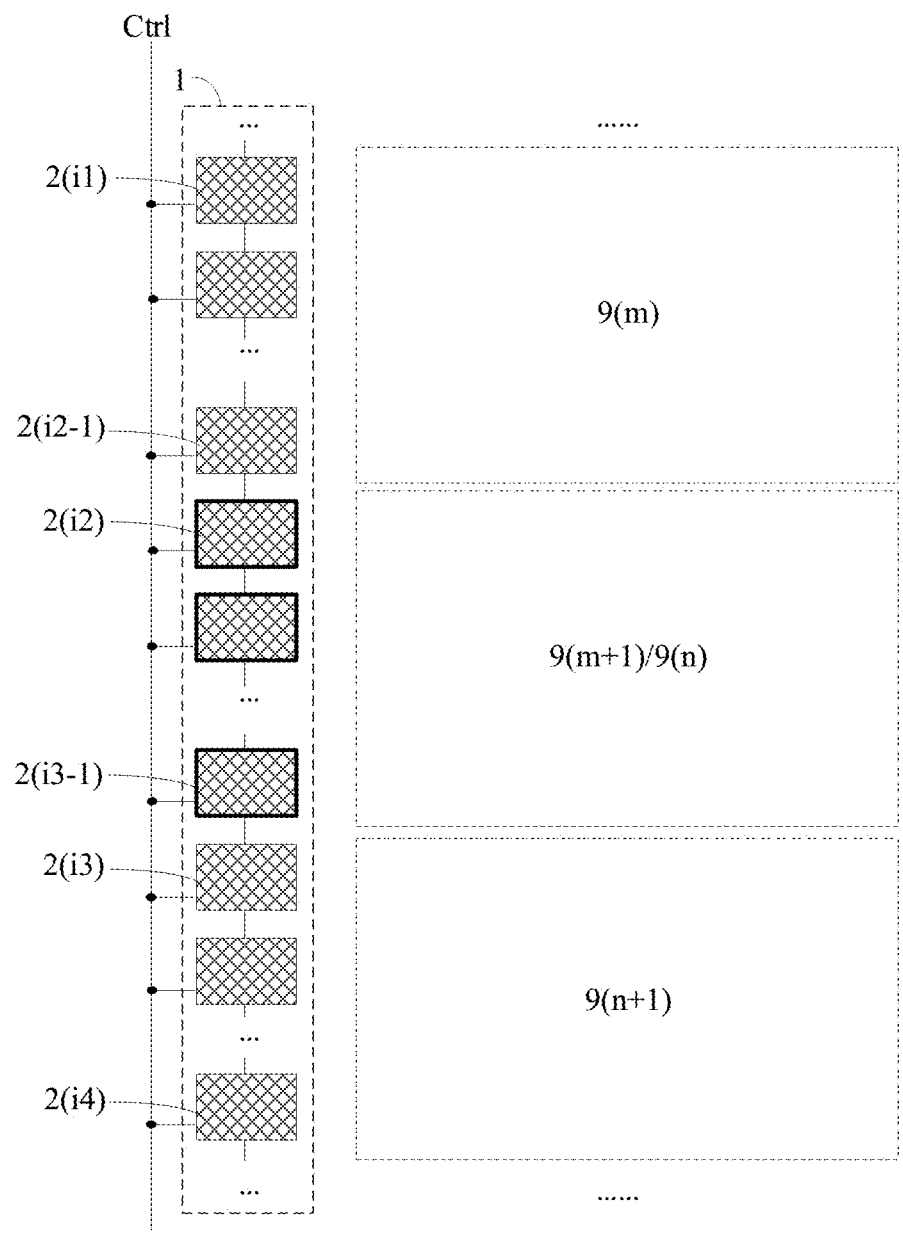
FIG. 11 is another schematic structural diagram of a display panel according to some embodiments of the present disclosure.
Figure 12:
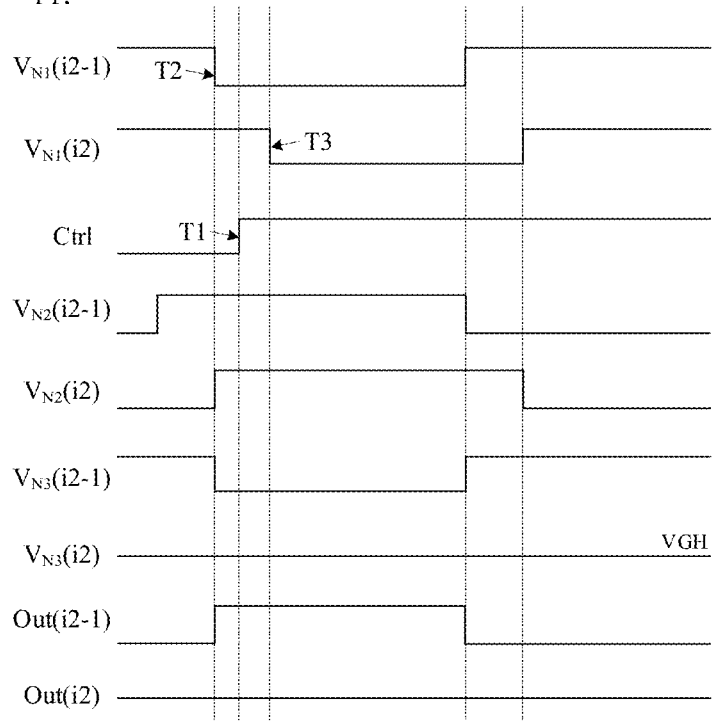
FIG. 12 is a timing sequence diagram of the display panel corresponding to FIG. 11 according to some embodiments of the present disclosure.
Figure 14:
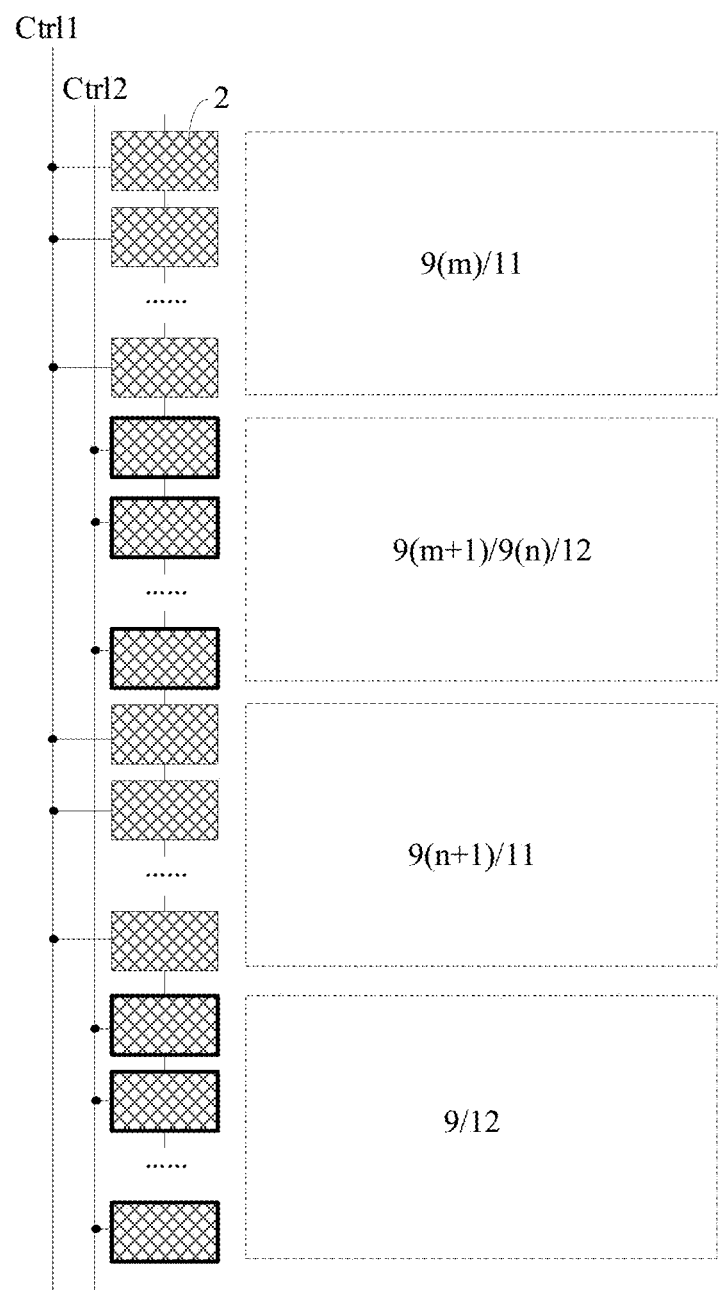
FIG. 14 is another schematic structural diagram of a display panel according to some embodiments of the present disclosure.
Figure 15:
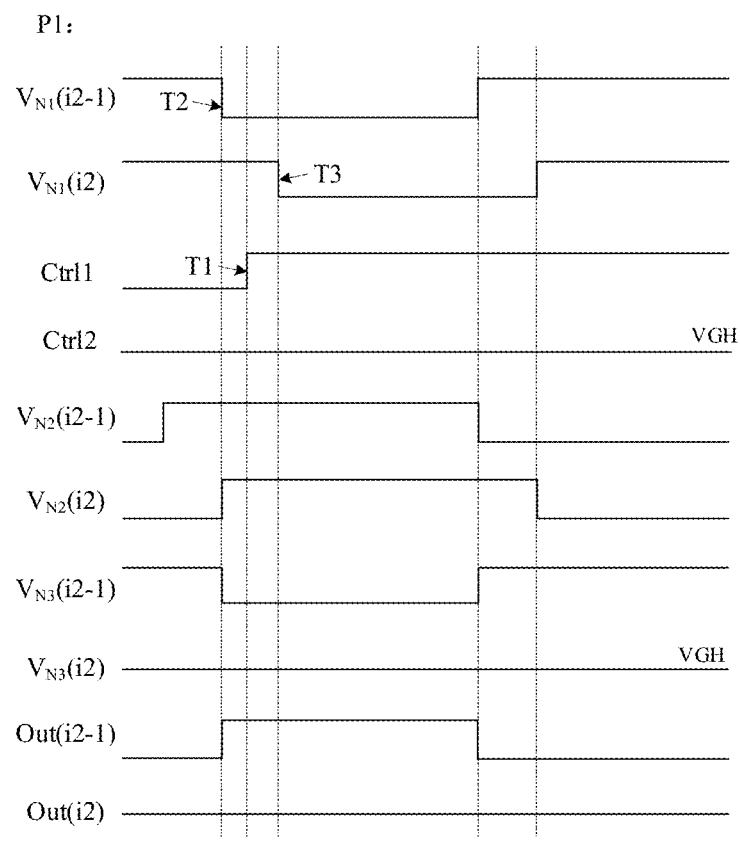
FIG. 15 is a timing sequence diagram of the display panel corresponding to FIG. 14 according to some embodiments of the present disclosure.

When performing high to low conversion, referring to FIG. 6, FIG. 11, and FIG. 12, or referring to FIG. 6, FIG. 14, and FIG. 15, before the potential VN1 (i2) of the first node N1 in the i2-th stage of the shift circuit 2 (i2) jumps to a low level, or when the potential VN1 (i2) of the first node N1 in the i2-th stage of the shift circuit 2 (i2) jumps to a low level, the frequency control signal sn-ctrl received by the shift circuit 2 corresponding to the low-frequency sub-region is a high level, so that the first control module 5 in this part of the shift circuit 2 can be cut off, and the signal path between the first node N1 and the third node N3 is cut off. Therefore, when the potential of the first node N1 in this part of shift circuit 2 changes to a low level, the low level of the first node N1 cannot be written into the third node N3, so that the second output terminal Out cannot output a high level, and can only continuously output a low level, thereby not refreshing data of the pixel circuit 01 in the low-frequency sub-region, and thus completing the high to low conversion.

With respect to the process P2 of low-frequency to high-frequency, it is assumed that the last stage of the shift circuit corresponding to the low-frequency sub-region is the (i3−1)-th stage of the shift circuit 2 (i3−1), and the last stage of the shift circuit corresponding to the high-frequency sub-region is the i3-th stage of the shift circuit 2 (i3).

Figure 13:
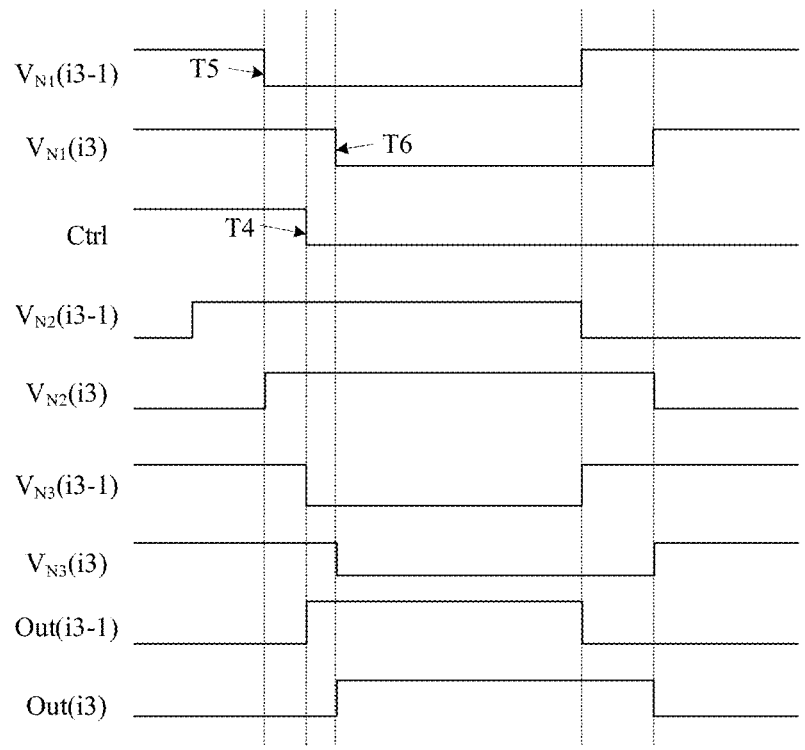
FIG. 13 is another timing sequence diagram of the display panel corresponding to FIG. 11 according to some embodiments of the present disclosure.
Figure 16:
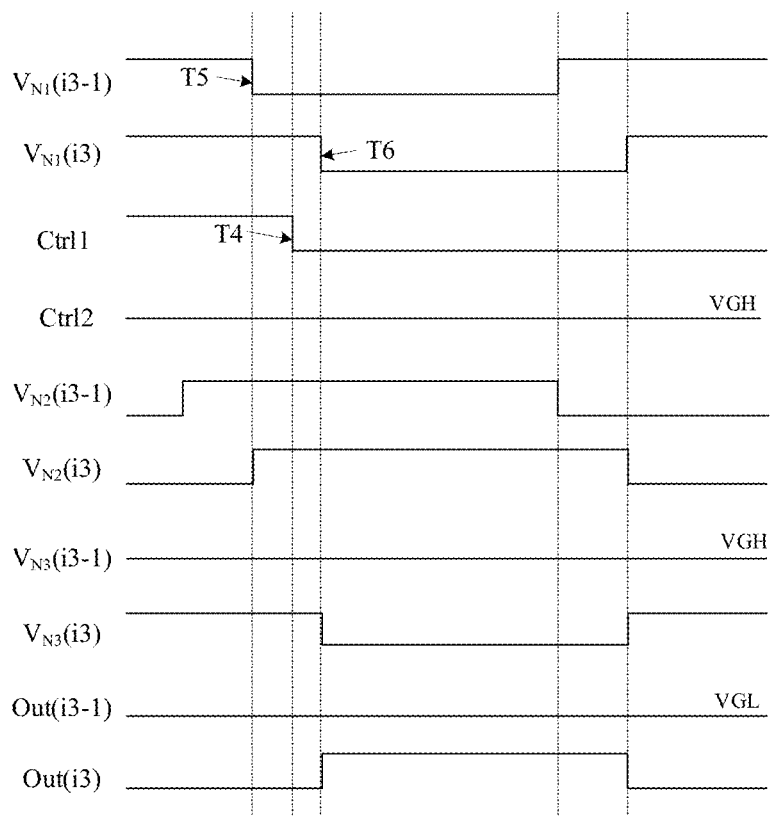
FIG. 16 is another timing sequence diagram of the display panel corresponding to FIG. 14 according to some embodiments of the present disclosure.

When performing low to high conversion, referring to FIG. 6, FIG. 11, and FIG. 13, or referring to FIG. 6, FIG. 14, and FIG. 16, before the potential VN1 (i3) of the first node N1 in the i3-th stage of the shift circuit 2 (i3) jumps to a low level, or when the potential VN1 (i3) of the first node N1 in the i3-th stage of the shift circuit 2 (i3) jumps to a low level, the frequency control signal sn-ctrl received by the shift circuit 2 corresponding to the high-frequency sub-region is a low level, and the first control module 5 in this part of shift circuit 2 is turned on. Therefore, when the potential of the first node N1 in this part of shift circuit 2 changes to a low level, the low level of the first node N1 may be written into the third node N3, so that the second output terminal Out can output a high level, thereby refreshing the pixel circuit 01 in the high-frequency sub-region, and thus completing the low to high conversion.

In some embodiments of the present disclosure, referring to FIG. 6 again, the gating unit 4 further includes a second control module 7, which is configured to write a second level to the third node N3 during at least part of a time period in which the potential of the second node N2 is the first level.

Since the gating unit 4 outputs a low level when the second node N2 is a low level, after setting the second control module 7, the second control module 7 can be controlled to be turned on when the second node N2 is a low level, and then a high level is written into the third node N3. Therefore, the first gating output transistor M017 in the gating unit 4 is turned off, and the high level cannot be output through the second output terminal Out, thereby achieving that the second output terminal Out accurately outputs a low level.

In addition, during the process P1 of high-frequency to low-frequency, setting the second control module 7 can further optimize the signal output by the last stage of the shift circuit 2 corresponding to the high-frequency sub-region.

Referring to FIG. 6, FIG. 11, and FIG. 12, when the shift circuit 2 in the shift register 1 is connected to only one frequency control line Ctrl, in the process P1 of high-frequency to low-frequency, when a signal on the frequency control line Ctrl jumps to a high level, so that the shift circuit 2 corresponding to the low-frequency sub-region receives a frequency control signal sn-ctrl at a high level, the frequency control signal sn-ctrl received by the shift circuit 2 corresponding to the low-frequency sub-region synchronously jumps to a high level. Taking the (i2−1)-th stage shift circuit 2 (i2−1) as an example, after the frequency control signal sn-ctrl received by the (i2−1)-th stage shift circuit 2 (i2−1) is changed to a high level, the first control module 5 will be turned off. Although the potential $V_{N3}$ (i2−1) of the third node N3 may be maintained at a previous low level after the first control module 5 is turned off, so that the first gating output transistor M017 continues to output a high level, however, if there is no control of other paths, when the potential $V_{N2}$ (i2−1) of following second node N2 is changed to a low level, and the signal Out (i2−1) output by the second output terminal Out is expected to be a low level, the high level continuously output by the first gating output transistor M017 conflicts with the signal Out (i2−1), resulting in the second output terminal Out being unable to accurately output a low level, thereby making the last row of pixel circuits 01 in the high-frequency sub-region work abnormally.

After providing the second control module 7, for the (i2−1)-th stage shift circuit 2 (i2−1), when the potential $V_{N2}$ (i2−1) of the second node N2 changes to a low level, the second control module 7 may be controlled to be turned on, and then one high level is written into the third node N3, so that the potential $V_{N3}$ (i2−1) of the third node N3 changes from a low level to a high level, and the first gating output transistor M017 is turned off, thereby achieving that the second output terminal Out can accurately output a low level, and thus improving the display effect of the last row of the high-frequency sub-region.

In some embodiments of the present disclosure, referring to FIG. 6 again, the control terminal of the second control module 7 is electrically connected to the second node N2.

In this structure, the conduction state of the second control module 7 is directly controlled by the second node N2.

When the second node N2 is a low level, the second control module 7 conducts to the third node N3 to write a high level. Therefore, the gating output module 6 cannot output a high level under the action of the third node N3 when the gating output module 6 needs to output a low level in response to the low level of the second node N2, thereby achieving the accuracy of the signal output by the second output terminal Out.

Figure 9:
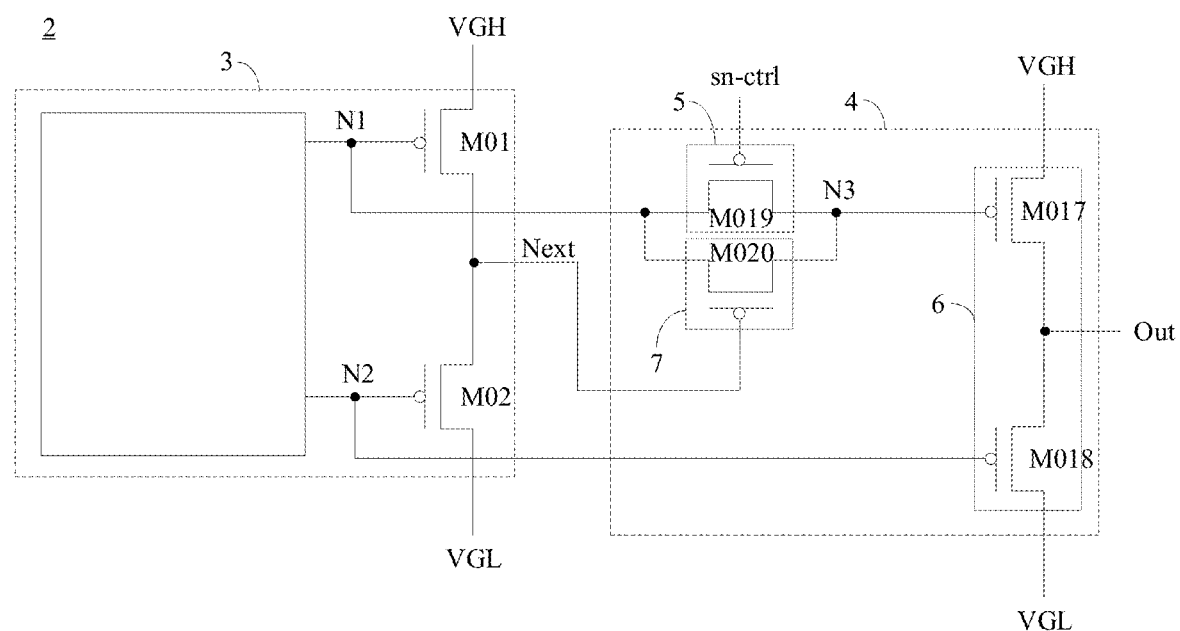
FIG. 9 is another schematic structural diagram of a shift circuit according to some embodiments of the present disclosure.

In some embodiments of the present disclosure, FIG. 9 is another schematic structural diagram of the shift circuit 2 according to some embodiments of the present disclosure, as shown in FIG. 9, the control terminal of the second control module 7 is electrically connected to the output terminal of the driving unit 3, that is, the control terminal of the second control module 7 is electrically connected to the first output terminal Next.

It can be known from the above analysis of the operating process of the driving unit 3 that the time when the first output terminal Next outputs the low level is related to the time when the second node N2 is the low level. Referring to FIG. 8, in the period t20 and the period t21, the second node N2 is a low level, and the first output terminal Next outputs a low level. In the period t23, the first node N1 and the second node N2 are both at a high level, and the first output terminal Next maintains outputting a low level. It can be seen that the first output terminal Next is also at a low level when the second node N2 is a low level, but the end time of the low level of the second node N2 is slightly earlier than the end time of the low level of the first output terminal Next. Therefore, the control terminal of the second control module 7 is electrically connected to the first output terminal Next, which can also satisfy that the second control module 7 is controlled to be turned on when the second node N2 is a low level. Therefore, the gating output module 6 cannot output a high level under the action of the third node N3 when the gating output module 6 needs to output a low level in response to the low level of the second node N2, thereby achieving the accuracy of the signal output by the second output terminal Out.

In some embodiments of the present disclosure, referring to FIG. 6 again, an input terminal of the second control module 7 is electrically connected to the first node N1.

It can be known from the foregoing analysis of the operating process of the driving unit 3 that the first node N1 is a high level when the second node N2 is a low level. Therefore, the input terminal of the second control module 7 is electrically connected to the first node N1, and a high level can be written to the third node N3 when the second node N2 is a low level and the second control module 7 is turned on.

Figure 10:
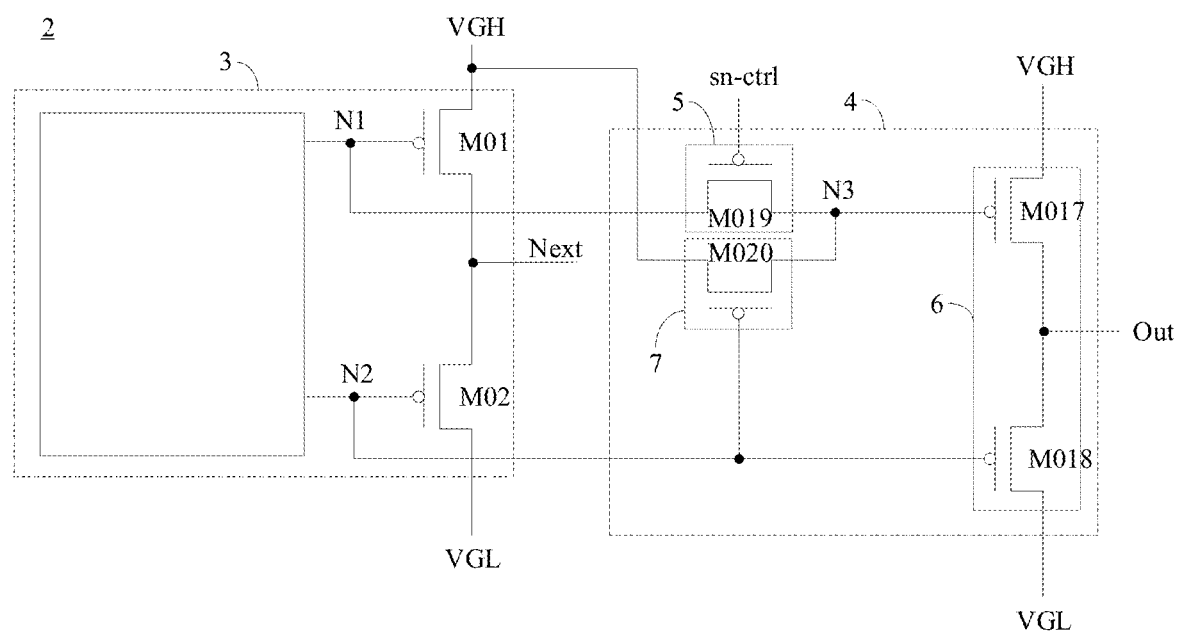
FIG. 10 is another schematic structural diagram of a shift circuit according to some embodiments of the present disclosure.

FIG. 10 is still another schematic structural diagram of the shift circuit 2 according to some embodiments of the present disclosure. In some embodiments of the present disclosure, as shown in FIG. 10, the input terminal of the second control module 7 is electrically connected to the first constant voltage line VGH, which is configured to provide the second level.

In this structure, the input terminal of the second control module 7 receives a stable high level, and when it is turned on, the accuracy and stability of the potential received by the third node N3 will be higher.

In some embodiments of the present disclosure, referring to FIG. 6, as shown in FIG. 11 to FIG. 13, FIG. 11 is another schematic structural diagram of a display panel according to some embodiments of the present disclosure, FIG. 12 is a timing sequence diagram of the display panel corresponding to FIG. 11, FIG. 13 is another timing sequence diagram of the display panel corresponding to FIG. 11. As shown in FIG. 14 to FIG. 16, FIG. 14 is still another schematic structural diagram of the display panel according to some embodiments of the present disclosure, FIG. 15 is a timing sequence diagram of the display panel corresponding to FIG. 14, FIG. 16 is another timing sequence diagram of the display panel corresponding to FIG. 14, the display panel includes at least two sub-regions 9.

In the first display mode, when the (m+1)-th sub-region 9 (m+1) is entered from the m-th sub-region 9 (m) and the (m+1)-th sub-region 9 (m+1) has a smaller refresh frequency than the m-th sub-region 9 (m), the frequency control signal received by the shift circuit 2 corresponding to the (m+1)-th sub-region 9 (m+1) starts to be the second level when the potential of the first node N1 in the first level shift circuit 2 corresponding to the (m+1)-th sub-region 9 (m+1) jumps to the first level, where m≥1.

That is, the m-th sub-region 9 (m) is a high-frequency sub-region, the (m+1)-th sub-region 9 (m+1) is a low-frequency sub-region. A process of entering the (m+1)-th sub-region 9 (m+1) from the m-th sub-region 9 (m) is a high-frequency to low-frequency process P1.

For example, the last stage of the shift circuit corresponding to the m-th sub-region 9 (m) is the (i2−1)-th stage of the shift circuit 2 (i2−1), and the first stage of the shift circuit corresponding to the (m+1)-th sub-region 9 (m+1) is the i2-th stage of the shift circuit 2 (i2).

When the (m+1)-th sub-region 9 (m+1) is entered from the m-th sub-region 9 (m), referring to FIG. 6, FIG. 11, and FIG. 12, or referring to FIG. 6, FIG. 14, and FIG. 15, before the potential $V_{N1}$ (i2) of the first node N1 in the i2-th stage of the shift circuit 2 (i2) jumps to a low level, or when the potential $V_{N1}$ (i2) of the first node N1 in the i2-th stage of the shift circuit 2 (i2) jumps to a low level, the frequency control signal sn-ctrl received by the shift circuit 2 corresponding to the (m+1)-th sub-region 9 (m+1) is a high level, so that the first control module in this part of the shift circuit 2 can be cut off, and the signal path between the first node N1 and the third node N3 is cut off. Therefore, when the potential of the first node N1 in this part of shift circuit 2 changes to a low level, the low level of the first node N1 cannot be written into the third node N3, so that the second output terminal Out cannot output a high level, and can only continuously output a low level, thereby not refreshing data of the pixel circuit 01 in the (m+1)-th sub-region 9 (m+1), and thus completing the high to low conversion.

In some embodiments of the present disclosure, in the first display mode, when the (n+1)-th sub-region 9 (n+1) is entered from the n-th sub-region 9 (n) and the (n+1)-th sub-region 9 (n+1) has a greater refresh frequency than the n-th sub-region 9 (n), the frequency control signal received by the shift circuit 2 corresponding to the (n+1)-th sub-region 9 (n+1) starts to be the first level when the potential of the first node N1 in the first stage of shift circuit 2 corresponding to the (n+1)-th sub-region 9 (n+1) jumps to the first level, where n≥1.

The n-th sub-region 9 (n) is a low-frequency sub-region, the (n+1)-th sub-region 9 (n+1) is a high-frequency sub-region. A process of entering the (n+1)-th sub-region 9 (n+1) from the n-th sub-region 9 (n) is a low-frequency to high-frequency switching process P2.

For example, the last stage of the shift circuit corresponding to the n-th sub-region 9 (n) is the (i3−1)-th stage of the shift circuit 2 (i3−1), and the second stage of the shift circuit corresponding to the (n+1)-th sub-region 9 (n+1) is the i3-th stage of the shift circuit 2 (i3).

When the (n+1)-th sub-region 9 (n+1) is entered from the n-th sub-region 9 (n), referring to FIG. 6, FIG. 11, and FIG. 13, or referring to FIG. 6, FIG. 14, and FIG. 16, before the potential $V_{N1}$ (i3) of the first node N1 in the i3-th stage of the shift circuit 2 (i3) jumps to a low level, or when the potential $V_{N1}$ (i3) of the first node N1 in the i3-th stage of the shift circuit 2 (i3) jumps to a low level, the frequency control signal sn-ctrl received by the shift circuit 2 corresponding to the (n+1)-th sub-region 9 (n+1) is a low level, and the first control module 5 in this part of shift circuit 2 is turned on. Therefore, when the potential of the first node N1 in this part of shift circuit 2 changes to a low level, the low level of the first node N1 may be written into the third node N3, so that the second output terminal Out can output a high level, thereby refreshing the pixel circuit 01 in the (n+1)-th sub-region 9 (n+1), and thus completing the low to high conversion.

In this way, the display panel can realize a partition frequency-division display function, and the display panel can perform better in processing different types of content such as dynamic images and static texts. For example, for a region where a dynamic image needs to be displayed, the region may be driven with a higher frequency to provide a smoother image update and reduce smear and blur. For a region where a static text needs to be displayed, the region may be driven with a lower frequency to reduce power consumption and extend the lifespan of the display panel.

It should be noted that, n=m+1 shown in FIG. 11 and FIG. 14 is merely an example for description, and there may not be a relationship between n and m. For example, the display panel may include only two sub-regions 9, which only perform one high-frequency to low-frequency conversion or one low-frequency to high-frequency conversion in the first display mode. In some embodiments of the present disclosure, the display panel may further include three sub-regions 9, which perform a high-frequency to low-frequency conversion and a low-frequency to high-frequency conversion in the first display mode. In some embodiments of the present disclosure, the display panel may include four or more sub-regions 9 for at least one high-frequency to low-frequency conversion and at least two low-frequency to high-frequency conversions, or for at least two high-frequency to low-frequency conversions and at least one low-frequency to high-frequency conversion. The number of sub-regions 9 is not specifically limited in the embodiments of the present disclosure. Accordingly, in the first display mode, there is no limitation on the number of high and low conversion times.

In some embodiments of the present disclosure, referring to FIG. 6, FIG. 11, and FIG. 12, or referring to FIG. 6, FIG. 14, and FIG. 15, when the (m+1)-th sub-region 9 (m+1) is entered from the m-th sub-region 9 (m), at the first time point T1, the frequency control signal received by the shift circuit 2 corresponding to the (m+1)-th sub-region 9 (m+1) jumps to the second level.

The first time point T1 is located between the second time point T2 and the third time point T3. The second time point T2 is a time point when the potential of the first node N1 in the last stage of shift circuit 2 corresponding to the m-th sub-region 9 (m) jumps to the first level, and the third time point T3 is a time point when the potential of the first node N1 in the first stage of shift circuit 2 corresponding to the (m+1)-th sub-region 9 (m+1) jumps to the first level.

The above-mentioned process is a process P1 of high-frequency to low-frequency.

There is a time interval between the first time point T1 and the third time point T3. That is, the frequency control signal sn-ctrl received by the shift circuit 2 corresponding to the (m+1)-th sub-region 9 (m+1) starts to be a high level before the potential $V_{N1}$ (i2) of the first node N1 of the i2-th stage shift circuit 2 (i2) becomes a low level, so that the first control module in this part of shift circuit 2 is in an off state before the third time point T3, which can more effectively prevent the low level of the first node N1 from being written into the third node N3 when the first node N1 is a low level, and thus achieving that this part of shift circuit 2 cannot output a high level.

Meanwhile, there is also a time interval between the first time point T1 and the second time point T2. Referring to FIG. 6, FIG. 11 and FIG. 12, when the shift circuit 2 in the shift register 1 is only connected to one frequency control line ctrl, even if the frequency control signal sn-ctrl received by the shift circuit 2 corresponding to the m-th sub-region 9 (m) also becomes a high level at the first time point T1, the first control module 5 in this part of the shift circuit 2 is turned off, but the third node N3 always receives the low level written by the first node N1 within the time period between the second time point T2 and the first time point T1, so that the third node N3 can still maintain the low level after the first control module 5 is turned off at the first time point T1, therefore this part of the shift circuit 2 still continues to output a high level, and the pixel circuit 01 in the m-th sub-region 9 (m) continues to be charged.

In some embodiments of the present disclosure, in combination with FIG. 6, FIG. 11 and FIG. 13, or in combination with FIG. 6, FIG. 14 and FIG. 16, when the (n+1)-th sub-region 9 (n+1) is entered from the n-th sub-region 9 (n), at the fourth time point T4, the frequency control signal received by the shift circuit 2 corresponding to the (n+1)-th sub-region 9 (n+1) jumps to the first level.

The fourth time point T4 is located between the fifth time point T5 and the sixth time point T6. The fifth time point T5 is a time point when the potential of the first node N1 in the last stage of the shift circuit 2 corresponding to the n-th sub-region 9 (n) jumps to the first level, and the sixth time point T6 is a time point when the potential of the first node N1 in the first stage of the shift circuit 2 corresponding to the (n+1)-th sub-region 9 (n+1) jumps to the first level.

The above-mentioned process is a process P2 of low-frequency to high-frequency.

There is a time interval between the fourth time point T4 and the sixth time point T6. That is, the frequency control signal sn-ctrl received by the shift circuit 2 corresponding to the (n+1)-th sub-region 9 (n+1) starts to be a low level before the potential $V_{N1}$ (i3) of the first node N1 of the i3-th stage shift circuit 2 (i3) becomes a low level, and then the first control module 5 in this part of shift circuit 2 is turned on before entering the sixth time point T6, so when the potential of the first node N1 in the shift circuit 2 corresponding to the (n+1)-th sub-region 9 (n+1) becomes a low level, the low level can be written into the third node N3 more timely, and thus achieving that this part of shift circuit 2 can output a high level normally.

Meanwhile, there is also a time interval between the fourth time point T4 and the fifth time point T5. Referring to FIG. 6, FIG. 11 and FIG. 13, when the shift circuit 2 in the shift register 1 is only connected to one frequency control line ctrl, even if the frequency control signal sn-ctrl received by the shift circuit 2 corresponding to the n-th sub-region 9 (n) also changes to a low level at the fourth time point T4, which causes the first control module 5 to be turned on, but in this part of time period between the fifth time point T5 and the fourth time point T4, the first control module 5 will be in an off state, and then the shift circuit 2 will output a low level without outputting a high level in this part of time period.

Figure 17:
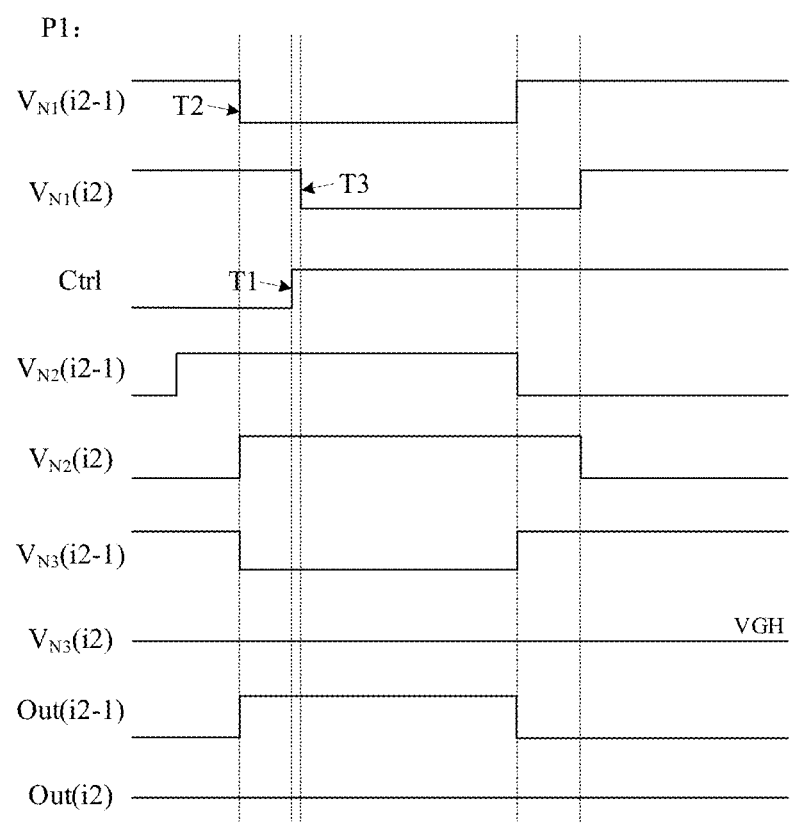
FIG. 17 is another timing sequence diagram of the display panel corresponding to FIG. 11 according to some embodiments of the present disclosure.
Figure 18:
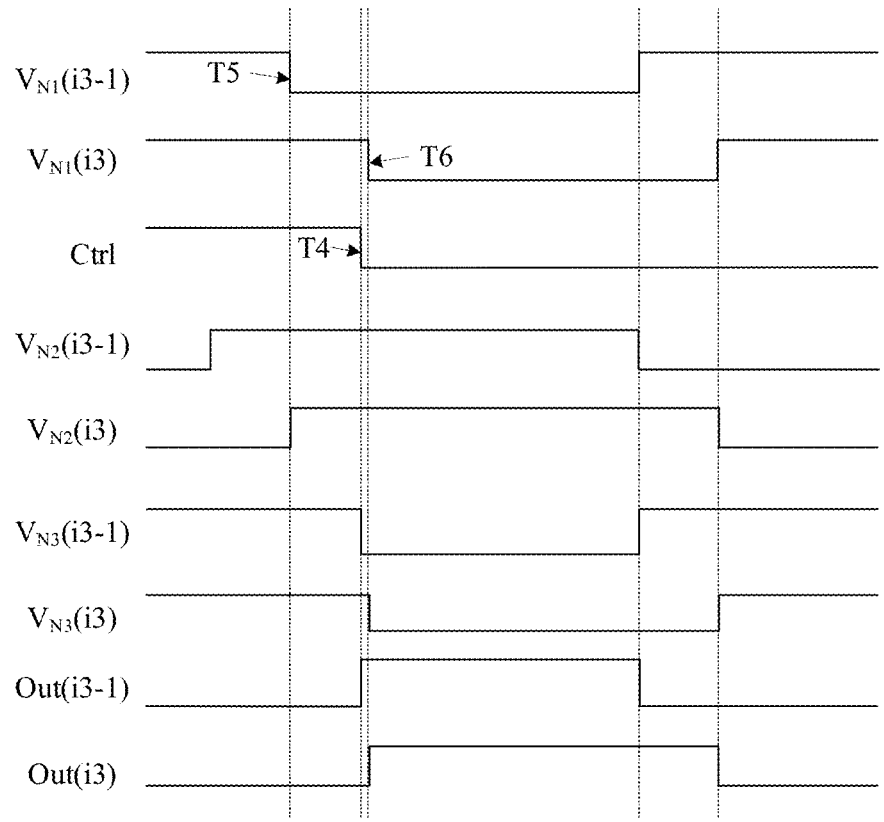
FIG. 18 is another timing sequence diagram of the display panel corresponding to FIG. 11 according to some embodiments of the present disclosure.

Further, as shown in FIG. 17, which is still another timing sequence diagram of the display panel corresponding to FIG. 11, a time interval between the first time point T1 and the second time point T2 is greater than a time interval between the first time point T1 and the third time point T3. In some embodiments of the present disclosure, as shown in FIG. 18, FIG. 18 is still another timing sequence diagram of the display panel corresponding to FIG. 11, a time interval between the fourth time point T4 and the fifth time point T5 is greater than a time interval between the fourth time point T4 and the sixth time point T6.

For a structure in which the shift circuit 2 in the shift register 1 is only connected to one frequency control line Ctrl, thus the driving effect is better.

In the process P1 of high-frequency to low-frequency, taking the last stage of the shift circuit corresponding to the m-th sub-region 9 (m) as an example, that is, taking the (i2−1)-th stage of shift circuit 2 (i2−1) as an example, the time interval between the first time point T1 and the second time point T2 is larger, the conduction time of the first control module 5 in the (i2−1)-th stage of shift circuit 2 (i2−1) is longer, and the cut-off time of the first control module 5 is shortened, so that more time of the third node N3 is written into the high level provided to the first node N1, and the high level of the third node N3 will be more stable.

In the process P2 of low-frequency to high-frequency, taking the last 1 stages of shift circuits corresponding to the n-th sub-region 9 (n), as an example, that is, taking the (i3−1)-th stage of shift circuit 2 (i3−1) as an example, the time interval between the fourth time point T4 and the fifth time point T5 is larger, and the time for the (i3−1)-th stage of the shift circuit 2 (i3−1) to output a low level may be prolonged, and the time for the (i3−1)-th stage of shift circuit 2 (i3−1) to output a high level may be shortened, so that the last row of pixel circuits in the n-th sub-region 9 (n) is not charged as much as possible, thereby meeting the requirement of low-frequency refresh thereof.

In some embodiments of the present disclosure, referring to FIG. 11 to FIG. 13, the first control module 5 in the a plurality of stages of shift circuits 2 in the shift register 1 is electrically connected to one frequency control line Ctrl. That is, the frequency control signal received by the shift circuit 2 corresponding to each sub-region 9 is provided by the frequency control signal Ctrl. In the process P1 of high-frequency to low-frequency and the process P2 of low-frequency to high-frequency, how the frequency control signal Ctrl jumps has been explained in detail earlier and will not be elaborated here.

The a plurality of stages of shift circuits 2 is electrically connected to only one frequency control line Ctrl, which can reduce the number of signal lines required to be provided in the display panel and save the wiring space.

In some embodiments of the present disclosure, referring to FIG. 14 to FIG. 16, the display area of the display panel includes at least two sub-regions 9, and the at least two sub-regions 9 include a first region 11 and a second region 12. In the first display mode, the first region 11 has a greater refresh frequency than the second region 12.

The first control module 5 in the shift circuit 2 corresponding to at least part of the first region 11 is electrically connected to the first frequency control line Ctrl1, and the first control module 5 in the shift circuit 2 corresponding to at least part of the second region 12 is electrically connected to the second frequency control line Ctrl2. That is, the first region 11 is a high-frequency sub-region, and the frequency control signal sn-ctrl received by the shift circuit 2 corresponding to the first region 11 is provided by the first frequency control line Ctrl1. The second region 12 is a low-frequency sub-region, and the frequency control signal sn-ctrl received by the shift circuit 2 corresponding to the second region 12 is provided by the second frequency control line Ctrl2.

The above-mentioned m-th sub-region 9 (m) is the high-frequency sub-region and the (n+1)-th sub-region 9 (n+1) is the first region 11, and the n-th sub-region 9 (n) and the (m+1)-th sub-region 9 (m+1) are the second region 12.

In this structure, different frequency control lines Ctrl are respectively provided for the high-frequency sub-region and the low-frequency sub-region, so that the frequency control signals received by the shift circuit 2 corresponding to the two sub-regions 9 can be independently controlled. In some frames, it is not desirable for the shift circuit 2 corresponding to the second region 12 to output a high level. Therefore, in this part of frames, the second frequency control line Ctrl2 can continuously output a high level, so that the shift circuit 2 corresponding to the second region 12 always receives a frequency control signal of a high level, and the first control module 5 in this part of shift circuit 2 is always in an off state, and thus preventing this part of the shift circuit 2 from outputting a high level.

In one structure, the shift circuit 2 corresponding to each first region 11 are electrically connected to the first frequency control line Ctrl1, and the shift circuit 2 corresponding to each second region 12 are electrically connected to the second frequency control line Ctrl2. In some embodiments of the present disclosure, the display panel may further include a third frequency control line, a fourth frequency control line, and the like. Some of the shift circuit 2 corresponding to the first region 11 are electrically connected to the first frequency control line Ctrl1. Some of the shift circuit 2 corresponding to the first region 11 are electrically connected to the third frequency control line of the first frequency control line, some of the shift circuit 2 corresponding to the second region 12 are electrically connected to the second frequency control line Ctrl2, some of the shift circuit 2 corresponding to the second region 12 are electrically connected to the fourth frequency control line, and other frequency control lines provide signals in a manner similar to the logic of the signals of the first frequency control line Ctrl1 and the second frequency control line Ctrl2, as long as it can achieve that the shift circuit 2 corresponding to the first region 11 outputs a high level in each frame, and the shift circuit 2 corresponding to the second region 12 outputs a high level in only some frames.

In some embodiments of the present disclosure, referring to FIG. 14 to FIG. 16, in the first display mode, the second frequency control line Ctrl2 provides the second level in some frames, so that the shift circuit 2 corresponding to the second region 12 always receives a high level frequency control signal, and the first control module 5 in this part of shift circuit 2 is always in an off state, to prevent this part of shift circuit 2 from outputting a high level.

Figure 19:
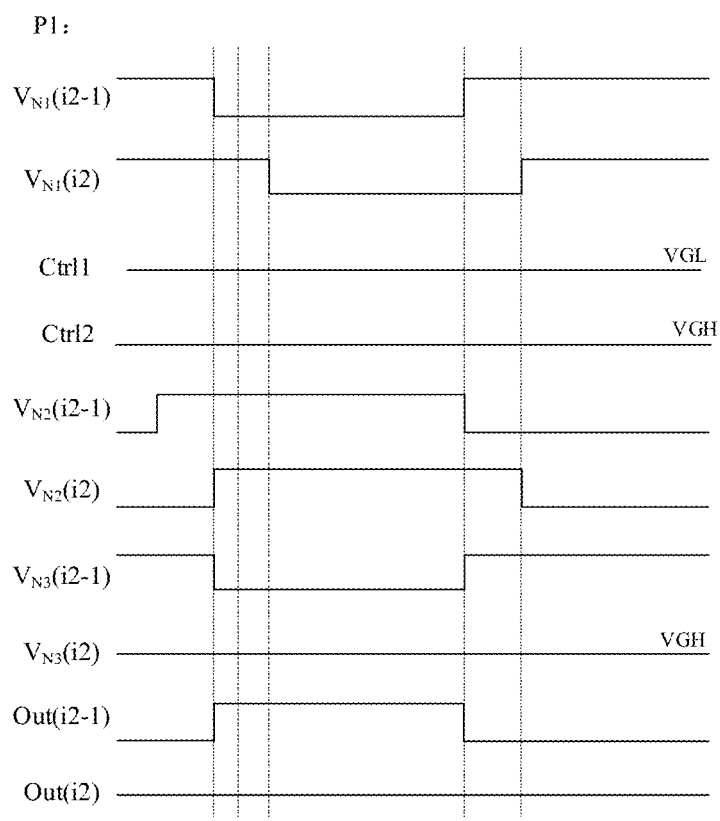
FIG. 19 is another timing sequence diagram of the display panel corresponding to FIG. 14 according to some embodiments of the present disclosure.
Figure 20:
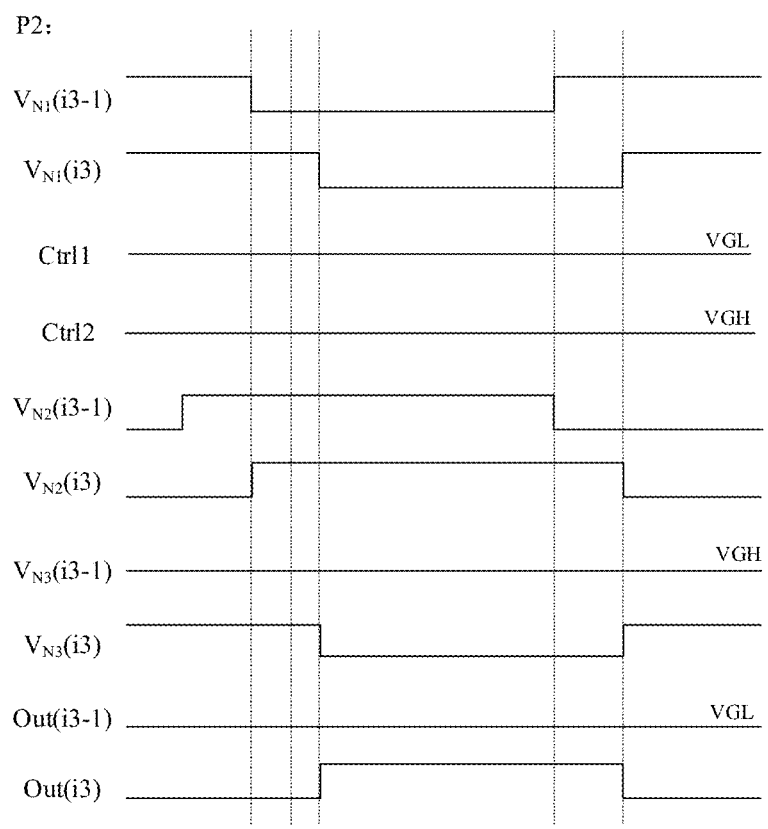
FIG. 20 is another timing sequence diagram of the display panel corresponding to FIG. 14 according to some embodiments of the present disclosure.

In some embodiments of the present disclosure, as shown in FIG. 19 and FIG. 20, FIG. 19 is still another timing sequence diagram of the display panel corresponding to FIG. 14, and FIG. 20 is still another timing sequence diagram of the display panel corresponding to FIG. 14. In the first display mode, the first frequency control line Ctrl1 provides the first level. The first region 11 is a high-frequency sub-region that performs data refresh in each frame. Therefore, the first frequency control line Ctrl1 can always provide a low level, so that the shift circuit 2 corresponding to the first region 11 always receives a low level frequency control signal, and the first control module 5 in this part of shift circuit 2 is always in an on state, so that this part of shift circuit 2 can output a high level normally in each frame.

In this embodiment of the present disclosure, one frame is F, $$F = \frac{1}{f1},$$

where f1 is a data refresh frequency of the first region 11, that is, a data refresh frequency of the high-frequency sub-region.

In some embodiments of the present disclosure, referring to FIG. 6 again, the gating unit further includes a capacitor module 10. One terminal of the capacitor module 10 is electrically connected to the first constant voltage line VGH, and the other terminal of the capacitor module 10 is electrically connected to the third node N3, where the first constant voltage line VGH is configured to provide the second level.

After the capacitor module 10 is disposed, the potential of the third node N3 may be stabilized by using the capacitor module 10. Particularly, in a structure in which the shift circuit 2 in the shift register 1 is electrically connected to only one frequency control line Ctrl, in combination with FIG. 6, FIG. 11 and FIG. 12, in the process P1 of high-frequency to low-frequency, after the frequency control line Ctrl starts to provide a high level at the first time point T1, the first control module 5 in the (i2−1)-th stage shift circuit 2 (i2−1) is turned off, and the first node N1 stops writing a signal to the third node N3. At this time, the potential of the third node N3 may be stabilized by using the capacitor module 10.

In some embodiments of the present disclosure, the capacitor module 10 may specifically include a voltage stabilizing capacitor C. A first plate of the voltage stabilizing capacitor C is electrically connected to the first constant voltage line VGH, and a second plate of the voltage stabilizing capacitor C is electrically connected to the third node N3.

In some embodiments of the present disclosure, referring to FIG. 6 again, the first control module 5 includes a first control transistor M19. A gate of the first control transistor M19 receives the frequency control signal sn-ctrl, a first electrode of the first control transistor M19 is electrically connected to the first node N1, and a second electrode of the first control transistor M19 is electrically connected to the third node N3.

In some embodiments of the present disclosure, the receiving frequency control signals sn-ctrl received by the first control transistors M19 in the plurality of shift circuits 2 may all be from the same frequency control line Ctrl, or the receiving frequency control signals sn-ctrl received by the first control transistors M19 in some shift circuits 2 may be from the first frequency control line Ctrl1, and the receiving frequency control signals sn-ctrl received by the first control transistors M19 in some shift circuit 2 may be from the second frequency control line Ctrl2.

When the frequency control signal sn-ctrl received by the first control transistor M19 is a low level, the first control transistor M19 is turned on to write the potential of the first node N1 into the third node N3. When the frequency control signal sn-ctrl received by the gate of the first control transistor M19 is a high level, the first control transistor M19 is turned off, and the potential of the first node N1 is stopped from being written into the third node N3.

In some embodiments of the present disclosure, referring to FIG. 6 again, the second control module 7 includes a second control transistor M20.

A gate of the second control transistor M20 is electrically connected to the second node N2 or the output terminal (the first output terminal Next) of the driving unit, a first electrode of the second control transistor M20 is electrically connected to the first node N1 or the first constant voltage line VGH, the first constant voltage line VGH is configured to provide a second level, and a second electrode of the second control transistor M20 is electrically connected to the third node N3, so that a high level can be written to the third node N3 when the second control transistor M20 is turned on.

In one structure, referring to FIG. 6, a gate of the second control transistor M20 is electrically connected to the second node N2, a first electrode of the second control transistor M20 is electrically connected to the first node N1, and a second electrode of the second control transistor M20 is electrically connected to the third node N3.

In some embodiments of the present disclosure, referring to FIG. 10, a gate of the second control transistor M20 is electrically connected to the second node N2, a first electrode of the second control transistor M20 is electrically connected to the first constant voltage line VGH, and a second electrode of the second control transistor M20 is electrically connected to the third node N3.

In some embodiments of the present disclosure, referring to FIG. 9, a gate of the second control transistor M20 is electrically connected to the first output terminal Next, a first electrode of the second control transistor M20 is electrically connected to the first node N1, and a second electrode of the second control transistor M20 is electrically connected to the third node N3.

In some embodiments of the present disclosure, a gate of the second control transistor M20 is electrically connected to the first output terminal Next, a first electrode of the second control transistor M20 is electrically connected to the first constant voltage line VGH, and a second electrode of the second control transistor M20 is electrically connected to the third node N3.

In some embodiments of the present disclosure, referring to FIG. 1, FIG. 4, and FIG. 6, the gating unit 4 is electrically connected to the pixel circuit 01 through the driving signal line 11. Specifically, referring to FIG. 1, the driving signal line 11 includes a third scanning line S2N, and the gating unit 4 is electrically connected to the threshold compensation transistor M3 in the pixel circuit 01 through the third scanning line S2N.

The gating output module 6 includes a first gating output transistor M017 and a second gating output transistor M018.

A gate of the first gating output transistor M017 is electrically connected to the third node N3, a first electrode of the first gating output transistor M017 is electrically connected to the first constant voltage line VGH, a second electrode of the first gating output transistor M017 is electrically connected to the driving signal line 11, and the first constant voltage line VGH is configured to provide the second level. When the third node N3 is a low level, the first gating output transistor M017 is turned on to output a high level.

A gate of the second gating output transistor M018 is electrically connected to the second node N2, a first electrode of the second gating output transistor M018 is electrically connected to the second constant voltage line VGL, a second electrode of the second gating output transistor M018 is electrically connected to the driving signal line 11, and the second constant voltage line VGL is configured to provide the first level. When the second node N2 is a low level, the second gating output transistor M018 is turned on and outputs a low level.

In some embodiments of the present disclosure, referring to FIG. 1, FIG. 4, and FIG. 6, the display panel further includes a pixel circuit 01, which includes a driving transistor M0 and a threshold compensation transistor M3. A gate of the threshold compensation transistor M3 is electrically connected to the output terminal (the second output terminal Out) of the gating unit 4, a first electrode of the threshold compensation transistor M3 is electrically connected to the second electrode of the driving transistor M0, and a second electrode of the threshold compensation transistor M3 is electrically connected to the gate of the driving transistor M0.

Referring to the description of the operation processes of the pixel circuit 01 and the shift circuit 2, in the first display mode: In each frame, the shift circuit 2 corresponding to the high-frequency sub-region outputs a high level, so as to perform the data refresh on the pixel circuit 01 in the high-frequency sub-region, to implement high-frequency driving. In some frames, the shift circuit 2 corresponding to the low-frequency sub-region outputs a high level, so as to perform the data refresh on the pixel circuit 01 in the low-frequency sub-region. In other frames, the shift circuit 2 corresponding to the low-frequency sub-region does not output a high level, so as to not perform the data refresh on the pixel circuit 01 in the low-frequency sub-region, to implement low-frequency driving.

Based on the same inventive concept, an embodiment of the present disclosure further provides a method for driving a display panel. In combination with FIG. 4 to FIG. 6, the display panel includes a shift register 1, which includes a plurality of stages of shift circuits 2 arranged in cascade, and the shift circuit 2 includes a driving unit 3 and a gating unit 4. The driving unit 3 has a first node N1 and a second node N2, and the gating unit 4 includes a first control module 5 and a gating output module 6.

The method includes: controlling the driving unit 3 to output a second level when a potential of the first node N1 is a first level, and controlling the driving unit 3 to output the first level when a potential of the second node N2 is the first level. An output signal of the driving unit 3 in a previous stage of the shift circuit 2 is an input signal of the driving unit 3 in a next stage of the shift circuit 2; controlling the first control module 5 to write a signal of the first node N1 into a third node N3 when a frequency control signal received by the first control module 5 is a first level; and controlling the gating output module 6 to output the second level when a potential of the third node N3 is the first level, and controlling the gating output module 6 to output the first level when a potential of the second node N2 is the first level.

Referring to the foregoing analysis, by using the method, the shift circuit 2 can be used to enable the display panel to implement partition frequency-division display. Moreover, the number of transistors in the shift circuit 2 is relatively small, and only P-type transistors can be adopted, thereby effectively improving the operating reliability of the shift circuit 2 and reducing the manufacturing cost thereof, and thus reducing the space occupied by the shift circuit 2.

In some embodiments of the present disclosure, referring to FIG. 6, the gating unit 4 further includes a second control module 7.

The method further includes: controlling the second control module 7 to write the second level to the third node N3 during at least part of a time period in which a potential of the second node N2 is the first level.

Referring to the foregoing analysis, since the gating unit 4 outputs a low level when the second node N2 is a low level, after setting the second control module 7, the second control module 7 can be controlled to be turned on when the second node N2 is a low level, and then a high level is written into the third node N3. Therefore, the first gating output transistor M017 in the gating unit 4 is turned off, and the high level cannot be output through the second output terminal Out, thereby achieving that the second output terminal Out accurately outputs a low level.

In addition, during the process P1 of high-frequency to low-frequency, setting the second control module 7 can also optimize the signal output by the last stage of the shift circuit 2 corresponding to the high-frequency sub-region, so as to accurately output a low level, thereby improving the driving accuracy of the last row of the high-frequency sub-region.

In some embodiments of the present disclosure, referring to FIG. 6, FIG. 11 to FIG. 13, or referring to FIG. 6, FIG. 14 to FIG. 16, the display panel includes at least two sub-regions 9.

In the first display mode, the method further includes:
when the (m+1)-th sub-region 9 (m+1) is entered from the m-th sub-region 9 (m) and the (m+1)-th sub-region 9 (m+1) has a smaller refresh frequency than the m-th sub-region 9 (m), the frequency control signal received by the shift circuit 2 corresponding to the (m+1)-th sub-region 9 (m+1) starts to be the second level when the potential of the first node N1 in the first level shift circuit 2 corresponding to the (m+1)-th sub-region 9 (m+1) jumps to the first level, where m≥1.

In some embodiments of the present disclosure, when the (n+1)-th sub-region 9 (n+1) is entered from the n-th sub-region 9 (n) and the (n+1)-th sub-region 9 (n+1) has a greater refresh frequency than the n-th sub-region 9 (n), the frequency control signal received by the shift circuit 2 corresponding to the (n+1)-th sub-region 9 (n+1) starts to be the first level when the potential of the first node N1 in the first stage of shift circuit 2 corresponding to the (n+1)-th sub-region 9 (n+1) jumps to the first level, where n≥1.

The foregoing process has been described in detail in the foregoing embodiments, and details are not described herein again. In this way, the display panel can realize a partition frequency-division display function, so that the display panel can perform better in processing different types of content such as dynamic images and static texts.

Further, referring to FIG. 6, FIG. 11, and FIG. 12, or referring to FIG. 6, FIG. 14, and FIG. 15, when the (m+1)-th sub-region 9 (m+1) is entered from the m-th sub-region 9 (m), at the first time point T1, the frequency control signal received by the shift circuit 2 corresponding to the (m+1)-th sub-region 9 (m+1) jumps to the second level. The first time point T1 is located between the second time point T2 and the third time point T3. The second time point T2 is a time point when the potential of the first node N1 in the last stage of shift circuit 2 corresponding to the m-th sub-region 9 (m) jumps to the first level, and the third time point T3 is a time point when the potential of the first node N1 in the first stage of shift circuit 2 corresponding to the (m+1)-th sub-region 9 (m+1) jumps to the first level.

The above process is a process P1 of high-frequency to low-frequency. There is a time interval between the first time point T1 and the third time point T3, and a time interval between the first time point T1 and the second time point T2, which can improve the display accuracy of the low-frequency sub-region and the high-frequency sub-region. The principle has been explained in detail in the above-mentioned embodiments and will not be elaborated here.

In some embodiments of the present disclosure, when the (n+1)-th sub-region 9 (n+1) is entered from the n-th sub-region 9 (n), at the fourth time T4, the frequency control signal received by the shift circuit 2 corresponding to the (n+1)-th sub-region 9 (n+1) jumps to the first level. The fourth time point T4 is located between the fifth time point T5 and the sixth time point T6. The fifth time point T5 is a time point when the potential of the first node N1 in the last stage of the shift circuit 2 corresponding to the n-th sub-region 9 (n) jumps to the first level, and the sixth time point T6 is a time point when the potential of the first node N1 in the first stage of the shift circuit 2 corresponding to the (n+1)-th sub-region 9 (n+1) jumps to the first level.

The above process is a process P2 of low-frequency to high-frequency. There is a time interval between the fourth time point T4 and the sixth time point T6, and a time interval between the fourth time point T4 and the fifth time point T5, which can also improve the display accuracy of the low-frequency sub-region and the high-frequency sub-region. The principle has been explained in detail in the above-mentioned embodiments and will not be elaborated here.

In some embodiments of the present disclosure, referring to FIG. 14 to FIG. 16, the display area of the display panel includes at least two sub-regions 9, and the at least two sub-regions 9 include a first region 11 and a second region 12. In the first display mode, the first region 11 has a greater refresh frequency than the second region 12.

The first control module 5 in the shift circuit 2 corresponding to at least part of the first region 11 is electrically connected to the first frequency control line Ctrl1, and the first control module 5 in the shift circuit 2 corresponding to at least part of the second region 12 is electrically connected to the second frequency control line Ctrl2.

In the first display mode, the second frequency control line Ctrl2 is controlled to provide the second level in some frames.

In this structure, different frequency control lines Ctrl are respectively provided for the high-frequency sub-region and the low-frequency sub-region, so that the frequency control signals received by the shift circuit 2 corresponding to the two sub-regions 9 can be independently controlled. In some frames, it is not desirable for the shift circuit 2 corresponding to the second region 12 to output a high level. Therefore, in this part of frames, the second frequency control line Ctrl2 can continuously output a high level, so that the shift circuit 2 corresponding to the second region 12 always receives a frequency control signal of a high level, and the first control module 5 in this part of shift circuit 2 is always in an off state, and thus preventing this part of the shift circuit 2 from outputting a high level.

Figure 21:
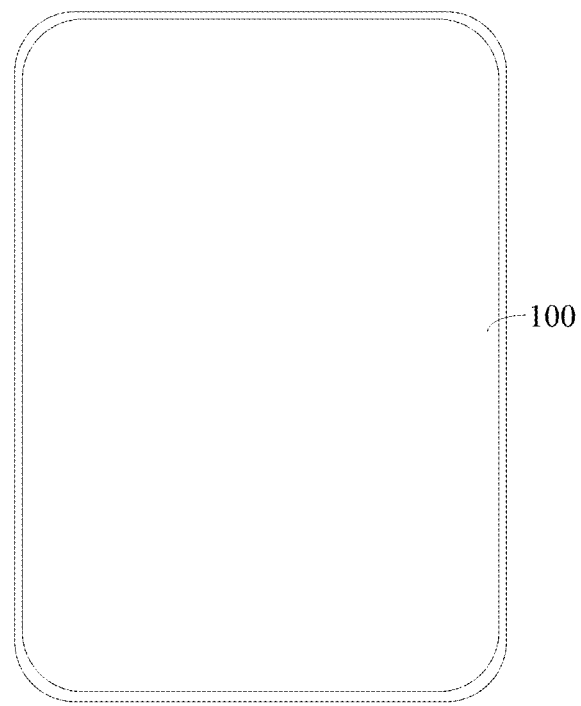
FIG. 21 is a structural schematic diagram of a display apparatus according to some embodiments of the present disclosure.

Based on the same inventive concept, the present disclosure further provides a display apparatus. As shown in FIG. 21, which is a schematic structural diagram of a display apparatus according to some embodiments of the present disclosure, the display apparatus includes the display panel 100 mentioned above. The display apparatus shown in FIG. 21 is merely illustrative, and the display apparatus may be any electronic device having a display function such as a mobile phone, a tablet computer, a laptop computer, an e-book, and a television.

The above are merely exemplary embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the embodiments described herein, and can make various modifications, readjustments, and substitutions without departing from the scope of the present disclosure.

What is claimed is:

1. A display panel, comprising:
a shift register, wherein the shift register comprises a plurality of stages of shift circuits arranged in cascade, at least one of the shift circuits comprises a driving unit and a gating unit, wherein an output signal of the driving unit in a previous stage of the shift circuit is an input signal of the driving unit in a next stage of the shift circuit;
wherein the driving unit has a first node and a second node, and the driving unit outputs a second level when a potential of the first node is a first level, and outputs the first level when a potential of the second node is the first level; and
wherein the gating unit comprises a first control module and a gating output module, wherein the first control module is configured to write a signal of the first node into a third node when a frequency control signal received by the first control module is the first level, and the gating output module is configured to output the second level when a potential of the third node is the first level, and output the first level when a potential of the second node is the first level.

2. The display panel according to claim 1, wherein the gating unit further comprises a second control module, and the second control module is configured to write the second level to the third node during at least part of a time period in which a potential of the second node is the first level.

3. The display panel according to claim 2, wherein a control terminal of the second control module is electrically connected to the second node.

4. The display panel according to claim 2, wherein a control terminal of the second control module is electrically connected to an output terminal of the driving unit.

5. The display panel according to claim 2, wherein an input terminal of the second control module is electrically connected to the first node.

6. The display panel according to claim 2, wherein an input terminal of the second control module is electrically connected to a first constant voltage line, the first constant voltage is configured to provide the second level.

7. The display panel according to claim 2, wherein the second control module comprises a second control transistor; and
a gate of the second control transistor is electrically connected to the second node or an output terminal of the driving unit, a first electrode of the second control transistor is electrically connected to the first node or a first constant voltage line, the first constant voltage line is configured to provide the second level, and a second electrode of the second control transistor is electrically connected to the third node.

8. The display panel according to claim 1, wherein the display panel comprises at least two sub-regions; in the first display mode:
when a (m+1)-th sub-region is entered from a m-th sub-region and the (m+1)-th sub-region has a smaller refresh frequency than the m-th sub-region, the frequency control signal received by the shift circuit corresponding to the (m+1)-th sub-region starts to be the second level at the latest when a potential of the first node in a first stage of the shift circuit corresponding to the (m+1)-th sub-region jumps to the first level, where m≥1; and/or
when a (n+1)-th sub-region is entered from a n-th sub-region and the (n+1)-th sub-region has a greater refresh frequency than the n-th sub-region, the frequency control signal received by the shift circuit corresponding to the (n+1)-th sub-region starts to be the first level at the latest when a potential of the first node in a first stage of the shift circuit corresponding to the (n+1)-th sub-region jumps to the first level, where n≥1.

9. The display panel according to claim 8, wherein when the (m+1)-th sub-region is entered from the m-th sub-region, the frequency control signal received by the shift circuit corresponding to the (m+1)-th sub-region jumps to the second level at a first time point; wherein the first time point is located between a second time point and a third time point, the second time point is a time point at which a potential of the first node in the last stage of the shift circuit corresponding to the m-th sub-region jumps to the first level, and the third time point is a time point at which a potential of the first node in the last stage of the shift circuit corresponding to the (m+1)-th sub-region jumps to the first level; and/or
when the (n+1)-th sub-region is entered from the n-th sub-region, the frequency control signal received by the shift circuit corresponding to the (n+1)-th sub-region jumps to the first level at a fourth time point; wherein the fourth time point is located between a fifth time point and a sixth time point, the fifth time point is a time point at which a potential of the first node in the last stage of the shift circuit corresponding to the n-th sub-region jumps to the first level, and the sixth time point is a time point at which a potential of the first node in the last stage of the shift circuit corresponding to the (n+1)-th sub-region jumps to the first level.

10. The display panel according to claim 9, wherein:
a time interval between the first time point and the second time point is greater than a time interval between the first time point and the third time point; and/or
a time interval between the fourth time point and the fifth time point is greater than a time interval between the fourth time point and the sixth time point.

11. The display panel according to claim 1, wherein all first control modules in the plurality of stages of shift circuits are electrically connected to frequency control lines.

12. The display panel according to claim 1, wherein a display region of the display panel comprises at least two sub-regions, the at least two sub-regions comprise a first region and a second region, and in a first display mode, the first region has a greater refresh frequency than the second region; and
the first control module in the shift circuit corresponding to at least part of the first region is electrically connected to a first frequency control line, and the first control module in the shift circuit corresponding to at least part of the second region is electrically connected to a second frequency control line.

13. The display panel according to claim 12, wherein in the first display mode, the second frequency control line provides the second level in some frames.

14. The display panel according to claim 1, wherein the gating unit further comprises a capacitor module, one terminal of the capacitor module is electrically connected to a first constant voltage line, and the other terminal of the capacitor module is electrically connected to the third node, wherein the first constant voltage line is configured to provide the second level.

15. The display panel according to claim 1, wherein the first control module comprises a first control transistor, a gate of the first control transistor receives the frequency control signal, a first electrode of the first control transistor is electrically connected to the first node, and a second electrode of the first control transistor is electrically connected to the third node.

16. The display panel according to claim 1, wherein the gating unit is electrically connected to a pixel circuit through a driving signal line;
the gating output module comprises a first gating output transistor and a second gating output transistor;
a gate of the first gating output transistor is electrically connected to the third node, a first electrode of the first gating output transistor is electrically connected to a first constant voltage line, a second electrode of the first gating output transistor is electrically connected to the driving signal line, and the first constant voltage line is configured to provide the second level;
a gate of the second gating output transistor is electrically connected to the second node, a first electrode of the second gating output transistor is electrically connected to a second constant voltage line, a second electrode of the second gating output transistor is electrically connected to the driving signal line, and the second constant voltage line is configured to provide the first level.

17. The display panel according to claim 1, further comprising a pixel circuit,
wherein the pixel circuit comprises a driving transistor and a threshold compensation transistor, a gate of the threshold compensation transistor is electrically connected to an output terminal of the gating unit, a first electrode of the threshold compensation transistor is electrically connected to a second electrode of the driving transistor, and a second electrode of the threshold compensation transistor is electrically connected to a gate of the driving transistor.

18. A method for driving a display panel, wherein the display panel comprises a shift register, the shift register comprises a plurality of stages of shift circuits arranged in cascade, at least one of the shift circuits comprises a driving unit and a gating unit;
the driving unit has a first node and a second node, and the gating unit comprises a first control module and a gating output module;
the method comprises following steps:
controlling the driving unit to output a second level when a potential of the first node is a first level, and controlling the driving unit to output the first level when a potential of the second node is the first level, wherein an output signal of the driving unit in a previous stage of the shift circuit is an input signal of the driving unit in a next stage of the shift circuit;

controlling the first control module to write a signal of the first node into a third node when a frequency control signal received by the first control module is a first level; and controlling the gating output module to output the second level when a potential of the third node is the first level, and controlling the gating output module to output the first level when a potential of the second node is the first level.

19. The method according to claim 18, wherein the gating unit further comprises a second control module; and the method further comprises: controlling the second control module to write the second level to the third node during at least part of a time period in which a potential of the second node is the first level.

20. The method according to claim 18, wherein the display panel comprises at least two sub-regions;

in the first display mode, the method further comprises:

when a m-th sub-region enters a (m+1)-th sub-region and the (m+1)-th sub-region has a smaller refresh frequency than the m-th sub-region, at the latest when a potential of the first node in a first stage of the shift circuit corresponding to the (m+1)-th sub-region jumps to the first level, the frequency control signal received by the shift circuit corresponding to the (m+1)-th sub-region starts to be the second level, where m≥1; and/or when a n-th sub-region enters a (n+1)-th sub-region and the (n+1)-th sub-region has a greater refresh frequency than the n-th sub-region, at the latest when a potential of the first node in a first stage of the shift circuit corresponding to the (n+1)-th sub-region jumps to the first level, the frequency control signal received by the shift circuit corresponding to the (n+1)-th sub-region starts to be the first level, where n≥1.

21. The method according to claim 20, wherein when the (m+1)-th sub-region is entered from the m-th sub-region, the frequency control signal received by the shift circuit corresponding to the (m+1)-th sub-region jumps to the second level at a first time point;

wherein the first time point is located between a second time point and a third time point, the second time point is a time point at which a potential of the first node in the last stage of the shift circuit corresponding to the m-th sub-region jumps to the first level, and the third time point is a time point at which a potential of the first node in the last stage of the shift circuit corresponding to the (m+1)-th sub-region jumps to the first level; and/or when the (n+1)-th sub-region is entered from the n-th sub-region, the frequency control signal received by the shift circuit corresponding to the (n+1)-th sub-region jumps to the first level at a fourth time point;

wherein the fourth time point is located between a fifth time point and a sixth time point, the fifth time point is a time point at which a potential of the first node in the last stage of the shift circuit corresponding to the n-th sub-region jumps to the first level, and the sixth time point is a time point at which a potential of the first node in the last stage of the shift circuit corresponding to the (n+1)-th sub-region jumps to the first level.

22. The method according to claim 18, wherein a display region of the display panel comprises at least two sub-regions, the at least two sub-regions comprise a first region and a second region, and in a first display mode, the first region has a greater refresh frequency than the second region;

the first control module in the shift circuit corresponding to at least part of the first region is electrically connected to a first frequency control line, and the first control module in the shift circuit corresponding to at least part of the second region is electrically connected to a second frequency control line; and wherein, in the first display mode, the second frequency control line is controlled to provide the second level in some frames.

23. A display apparatus, comprising a display panel, wherein the display panel comprises:

a shift register, wherein the shift register comprises a plurality of stages of shift circuits arranged in cascade, at least one of the shift circuits comprises a driving unit and a gating unit, wherein an output signal of the driving unit in a previous stage of the shift circuit is an input signal of the driving unit in a next stage of the shift circuit;

wherein the driving unit has a first node and a second node, and the driving unit outputs a second level when a potential of the first node is a first level, and outputs the first level when a potential of the second node is the first level; and wherein the gating unit comprises a first control module and a gating output module, wherein the first control module is configured to write a signal of the first node into a third node when a frequency control signal received by the first control module is the first level, and the gating output module is configured to output the second level when a potential of the third node is the first level, and output the first level when a potential of the second node is the first level.

* * * * *